(12) United States Patent
Chou et al.

(10) Patent No.: US 12,051,719 B2
(45) Date of Patent: Jul. 30, 2024

(54) METHOD FOR MANUFACTURING SEMICONDUCTOR STRUCTURE WITH SINGLE SIDE CAPACITOR

(71) Applicant: NANYA TECHNOLOGY CORPORATION, New Taipei (TW)

(72) Inventors: Yu-Min Chou, Keelung (TW); Shih-Fan Kuan, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 253 days.

(21) Appl. No.: 17/748,869

(22) Filed: May 19, 2022

(65) Prior Publication Data

US 2023/0402501 A1 Dec. 14, 2023

(51) Int. Cl.
*H10B 12/00* (2023.01)
*H01L 23/522* (2006.01)
*H01L 49/02* (2006.01)

(52) U.S. Cl.
CPC .......... *H01L 28/91* (2013.01); *H01L 23/5223* (2013.01); *H01L 28/92* (2013.01); *H10B 12/033* (2023.02); *H10B 12/0335* (2023.02)

(58) Field of Classification Search
CPC .......... H01L 28/90–92; H10B 12/0387; H10B 12/033; H10B 12/31; H10B 12/377; H10B 12/318; H10B 12/09
See application file for complete search history.

(56) References Cited

U.S. PATENT DOCUMENTS

| | | | |
|---|---|---|---|
| 2013/0005110 A1* | 1/2013 | Yoon | ........................ H01L 28/90 438/381 |
| 2016/0247760 A1 | 8/2016 | Lee et al. | |
| 2019/0267423 A1 | 8/2019 | Lee et al. | |
| 2021/0167010 A1 | 6/2021 | Yang | |
| 2021/0226000 A1 | 7/2021 | Nishita et al. | |
| 2022/0028862 A1* | 1/2022 | Yokoyama | .............. H01L 28/90 |
| 2022/0115380 A1 | 4/2022 | Jung et al. | |

FOREIGN PATENT DOCUMENTS

| | | |
|---|---|---|
| CN | 108538822 A | 9/2018 |
| CN | 111106125 A | 5/2020 |
| CN | 113851466 A | 12/2021 |
| TW | 200802900 A | 1/2008 |
| TW | I763348 B | 5/2022 |

OTHER PUBLICATIONS

TW Office Action Application No. 11221059640 dated Oct. 24, 2023.

* cited by examiner

*Primary Examiner* — Jose R Diaz
(74) *Attorney, Agent, or Firm* — MUNCY, GEISSLER, OLDS & LOWE, P.C.

(57) ABSTRACT

The present disclosure provides a method of manufacturing a semiconductor structure. The method includes: providing a substrate; forming a first nitride layer, a first sacrificial layer, a second nitride layer, a second sacrificial layer and a third nitride layer in sequence over the substrate; forming a first opening and a second opening, wherein the first opening exposes a first landing pad in the substrate, and the second opening exposes a second landing pad in the substrate; forming a first electrode in the first opening and a second electrode in the second opening; removing the first sacrificial layer and the second sacrificial layer concurrently; and forming a conductive layer, conformal to the first electrode, the second electrode, the first nitride layer, the second nitride layer and the third nitride layer.

15 Claims, 24 Drawing Sheets

METHOD FOR MANUFACTURING SEMICONDUCTOR STRUCTURE WITH SINGLE SIDE CAPACITOR

TECHNICAL FIELD

The present disclosure relates to a method for manufacturing a semiconductor structure with a single side capacitor. Particularly, the present disclosure relates to a method for manufacturing a memory device including a single side capacitor.

DISCUSSION OF THE BACKGROUND

Semiconductor devices are used in a variety of electronic applications, such as personal computers, cellular phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. As the semiconductor industry has progressed into advanced technology process nodes in pursuit of greater device density, higher performance, and lower costs, challenges of simple capacitor structure and better performance of a memory cell have arisen.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a substrate having a first landing pad therein, and a first capacitor disposed over the substrate. The first capacitor includes: a first electrode, disposed over and extending vertically away from the first landing pad; a first dielectric layer, at least partially surrounding the first electrode, wherein the first electrode is shorter than the first dielectric layer; and a second electrode, surrounding the first dielectric layer and the first electrode.

In some embodiments, the semiconductor structure further includes: a first nitride layer, disposed over the first electrode and the first dielectric layer.

In some embodiments, the first nitride layer protrudes toward the first electrode.

In some embodiments, the second electrode surrounds the first nitride layer.

In some embodiments, the semiconductor structure further includes: a second nitride layer, surrounding a middle portion of the first capacitor.

In some embodiments, the second nitride layer contacts the first dielectric layer.

In some embodiments, the second nitride layer is surrounded by the second electrode.

In some embodiments, the first dielectric layer includes one or more high-k materials.

In some embodiments, the first electrode and the second electrode include a same metallic material.

In some embodiments, the first capacitor covers an entirety of an exposed surface of the first landing pad.

In some embodiments, the semiconductor structure further includes: a second capacitor, disposed over the substrate adjacent to the first capacitor, the second capacitor including: a third electrode, disposed over and extending vertically away from a second landing pad adjacent to the first landing pad in the substrate; a second dielectric layer, at least partially surrounding the third electrode, wherein the third electrode is shorter than the second dielectric layer; and a fourth electrode, surrounding the second dielectric layer and the third electrode, wherein the fourth electrode is physically connected to the second electrode.

Another aspect of the present disclosure provides a semiconductor structure. The semiconductor structure includes: a first landing pad and a second landing pad disposed in a substrate; a first conductive layer, disposed over and extending vertically away from the first landing pad; a second conductive layer, disposed over and extending vertically away from the second landing pad; a first dielectric layer, surrounding the first conductive layer; a second dielectric layer, surrounding the second conductive layer; a third conductive layer, surrounding the first dielectric layer and the second dielectric layer; and a first gap, disposed between the first dielectric layer and the second dielectric layer, and at least partially encircled by the third conductive layer.

In some embodiments, the semiconductor structure further includes: a first nitride layer, disposed between middle portions of the first dielectric layer and the second dielectric layer; and a second nitride layer, disposed between upper portions of the first dielectric layer and the second dielectric layer.

In some embodiments, the first gap is disposed between the first nitride layer and the substrate.

In some embodiments, the semiconductor structure further includes: a second gap, disposed over the first gap and between the second nitride layer and the first nitride layer, and at least partially encircled by the third conductive layer.

In some embodiments, the first conductive layer is shorter than the first dielectric layer, and a portion of the second nitride layer is surrounded by the first dielectric layer over the first conductive layer.

In some embodiments, the second conductive layer is shorter than the second dielectric layer, and a portion of the second nitride layer is surrounded by the second dielectric layer over the second conductive layer.

In some embodiments, the first nitride layer contacts the first dielectric layer and the second dielectric layer, and the second nitride layer contacts the first dielectric layer and the second dielectric layer.

Another aspect of the present disclosure provides a method of manufacturing a semiconductor structure. The method includes: providing a substrate; forming a first nitride layer, a first sacrificial layer, a second nitride layer, a second sacrificial layer and a third nitride layer in sequence over the substrate; forming a first opening and a second opening, wherein the first opening exposes a first landing pad in the substrate, and the second opening exposes a second landing pad in the substrate; forming a first electrode in the first opening and a second electrode in the second opening; removing the first sacrificial layer and the second sacrificial layer concurrently; and forming a conductive layer, conformal to the first electrode, the second electrode, the first nitride layer, the second nitride layer and the third nitride layer.

In some embodiments, the method further includes: removing a portion of the second nitride layer, thereby exposing a portion of the first sacrificial layer, after the formation of the second nitride layer.

In some embodiments, a portion of the second sacrificial layer contacts the first sacrificial layer.

In some embodiments, the method further includes: removing a portion of the third nitride layer, thereby exposing a portion of the second sacrificial layer, after the formation of the third nitride layer.

In some embodiments, a wet etching operation is performed to remove the first sacrificial layer and the second sacrificial layer concurrently.

In some embodiments, the first sacrificial layer includes borophosphosilicate glass (BPSG).

In some embodiments, the second sacrificial layer includes silane oxide.

In some embodiments, the method further includes: forming a high-k layer, thereby lining sidewalls of the first opening and the second opening, prior to the formation of the first electrode and the second electrode.

In some embodiments, the method further includes: removing a top portion of the first electrode in the first opening and a top portion of the second electrode in the second opening.

In some embodiments, the method further includes: forming a fourth nitride layer, thereby filling the first opening over the first electrode and the second opening over the second electrode, prior to the removal of the first sacrificial layer and the second sacrificial layer.

In some embodiments, the fourth nitride layer is disposed over the third nitride layer.

In some embodiments, the conductive layer surrounds the fourth nitride layer.

In some embodiments, a first gap is formed between the first electrode and the second electrode and between the second nitride layer and the third nitride layer after the removal of the first sacrificial layer and the second sacrificial layer.

In some embodiments, the conductive layer encircles the first gap in a cross-sectional view.

In some embodiments, a second gap is formed between the first electrode and the second electrode and between the first nitride layer and the second nitride layer after the removal of the first sacrificial layer and the second sacrificial layer.

In some embodiments, the conductive layer at least partially encircles the second gap.

In some embodiments, the first opening exposes an entirety of a top surface of the first landing pad, and the second opening exposes an entirety of a top surface of the second landing pad.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
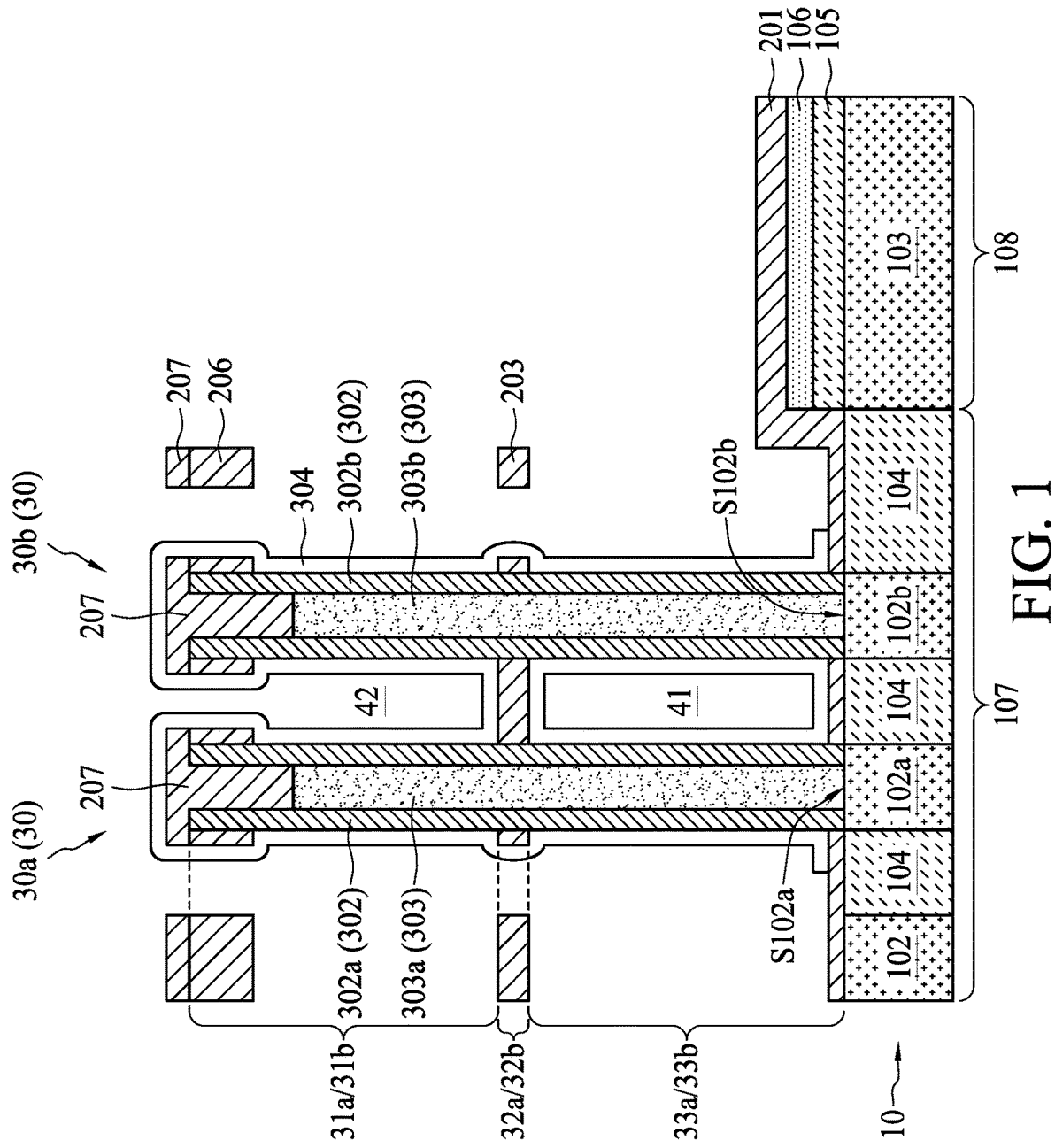
FIG. 1 is a cross-sectional diagram of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional diagram of a semiconductor structure in accordance with some embodiments of the present disclosure. The semiconductor structure may include a substrate 10 and a capacitor 30 disposed over the substrate 10. In some embodiments, the substrate 10 includes active components, passive components, and/or conductive elements. The active components may include a memory die (e.g., a dynamic random-access memory (DRAM) die, a static random-access memory (SRAM) die, etc.), a power management die (e.g., a power management integrated circuit (PMIC) die), a logic die (e.g., system-on-a-chip (SoC), central processing unit (CPU), graphics processing unit (GPU), application processor (AP), microcontroller, etc.), a radio frequency (RF) die, a sensor die, a micro-electro-mechanical-system (MEMS) die, a signal processing die (e.g., a digital signal processing (DSP) die), a front-end die (e.g., an analog front-end (AFE) die) or other active components. The passive components may include a capacitor, a resistor, an inductor, a fuse or other passive components. The conductive elements may include metal lines, metal islands, conductive vias, contacts or other conductive elements.

The active components, passive components, and/or conductive elements as mentioned above can be formed in and/or over a semiconductor substrate. The semiconductor substrate may be a bulk semiconductor, a semiconductor-on-insulator (SOI) substrate, or the like. The semiconductor substrate can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Si:Ge feature in which Si and Ge compositions change from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

The term "substrate" can be a general term and the substrate 10 can include all layers, elements and components disposed below the capacitor 30. For ease of illustration and simplicity of drawings, only a top portion of the substrate 10 is depicted in the figures.

In some embodiments, the substrate 10 includes a cell region 107 and a peripheral region 108. In some embodiments, active components are disposed mainly in the cell region 107. In some embodiments, the peripheral region 108 surrounds the cell region 107. In some embodiments, the substrate 10 includes one or more landing pads 102 and an insulating layer 104 separating the landing pads 102 in the cell region 107. In some embodiments, the landing pads 102 are electrically isolated from each other by the insulating layer 104. In some embodiments, the substrate 10 includes a conductive island 103 in the peripheral region 108 at an elevation same as those of the landing pads 102 and the insulating layer 104. In some embodiments, the substrate 10 includes multiple dielectric layers (e.g., 105 and 106) disposed over the conductive island 103 in the peripheral region 108. In some embodiments, the dielectric layers 105 and 106 are at an elevation higher than those of the landing pads 102.

In some embodiments, the capacitor 30 represents a single capacitor. In some embodiments, the capacitor(s) 30 may be a collective term for all capacitors disposed over the substrate 10 at a same elevation. In some embodiments, the capacitor 30 includes a first capacitor 30a and a second capacitor 30b. The first capacitor 30a and the second capacitor 30b may share an electrode. In some embodiments, the first capacitor 30a and the second capacitor 30b are structurally similar to each other or mirror each other.

The first capacitor 30a may include a first bottom electrode 303a, a first dielectric layer 302a and a top electrode 304. In some embodiments, the first bottom electrode 303a functions as a top electrode, and the electrode 304 functions as a bottom electrode of the first capacitor 30a. In some embodiments, the first capacitor 30a is disposed over and extends vertically away from one of the landing pads 102. For ease of illustration, the landing pad 102 covered by the first bottom electrode 303a is labelled as 102a in FIG. 1. In some embodiments, the first dielectric layer 302a at least partially surrounds the first bottom electrode 303a, wherein the first bottom electrode 303a is shorter than the first dielectric layer 302a. In some embodiments, the first dielectric layer 302a can include silicon oxide ($SiO_x$), silicon nitride ($Si_xN_y$), silicon oxynitride (SiON), or a combination thereof. In some embodiments, the first dielectric layer 302a can include dielectric material(s), such as high-k dielectric material. In some embodiments, the high-k dielectric material has a dielectric constant (k value) greater than 3.9. The high-k dielectric material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$), silicates of one or more of $ZrO_2$, $HfO_2$, $Al_2O_3$, $Y_2O_3$, $La_2O_3$ or aluminates of one or more of $ZrO_2$, $HfO_2$, $Y_2O_3$, $La_2O_3$, another applicable material, or a combination thereof. Other suitable materials are within the contemplated scope of this disclosure.

The second capacitor 30b may include a second bottom electrode 303b, a second dielectric layer 302b and the top electrode 304. In some embodiments, the second bottom electrode 303b functions as a top electrode, and the top electrode 304 functions as a bottom electrode of the second capacitor 30b. In other words, the first capacitor 30a and the second capacitor 30b share the top electrode 304. In some embodiments, the top electrode 304 functions as bottom electrodes of the first capacitor 30a and the second capacitor 30b. In some embodiments, the second capacitor 30b is disposed over and extends vertically away from one of the landing pads 102 adjacent to the landing pad 102a. For ease of illustration, the landing pad 102 covered by the second bottom electrode 303b is labelled as 102b in FIG. 1. In some embodiments, the second dielectric layer 302b at least partially surrounds the second bottom electrode 303b, wherein the second bottom electrode 303b is shorter than the second dielectric layer 302b. In some embodiments, a material of the second dielectric layer 302b is the same as that of the first dielectric layer 302a.

The semiconductor structure may further include a nitride layer 207 disposed over the first bottom electrode 303a and the first dielectric layer 302a. In some embodiments, the nitride layer 207 protrudes toward the first bottom electrode 303a. In some embodiments, the nitride layer 207 is at least partially surrounded by the first dielectric layer 302a. The nitride layer 207 may also be disposed over the second bottom electrode 303b and the second dielectric layer 302b. In some embodiments, the nitride layer 207 protrudes toward the second bottom electrode 303b. In some embodiments, the nitride layer 207 is at least partially surrounded by the second dielectric layer 302b. In some embodiments, the nitride layer 207 is surrounded by the top electrode 304.

The semiconductor structure may further include a nitride layer 203 surrounding a middle portion 32a of the first dielectric layer 302a and a middle portion 32b of the second dielectric layer 302b. In some embodiments, the nitride layer 203 contacts the first dielectric layer 302a. In some embodiments, the nitride layer 203 contacts the second dielectric layer 302b. In some embodiments, the middle portion 32a and the middle portion 32b are at a same elevation. In some embodiments, the nitride layer 203 is surrounded by the top electrode 304. In some embodiments, a first gap 41 is defined between a lower portion 33a of the first dielectric layer 302a and a lower portion 33b of the second dielectric layer 302b. In some embodiments, the first gap 41 is disposed between the nitride layer 203 and the substrate 10. In some embodiments, the first gap 41 is encircled by the top electrode 304. In some embodiments, a second gap 42 is defined between an upper portion 31a of the first dielectric layer 302a and an upper portion 31b of the second dielectric layer 302b. In some embodiments, the second gap 42 is above the nitride layer 203. In some embodiments, the second gap 42 is partially encircled by the top electrode 304.

Figure 2:
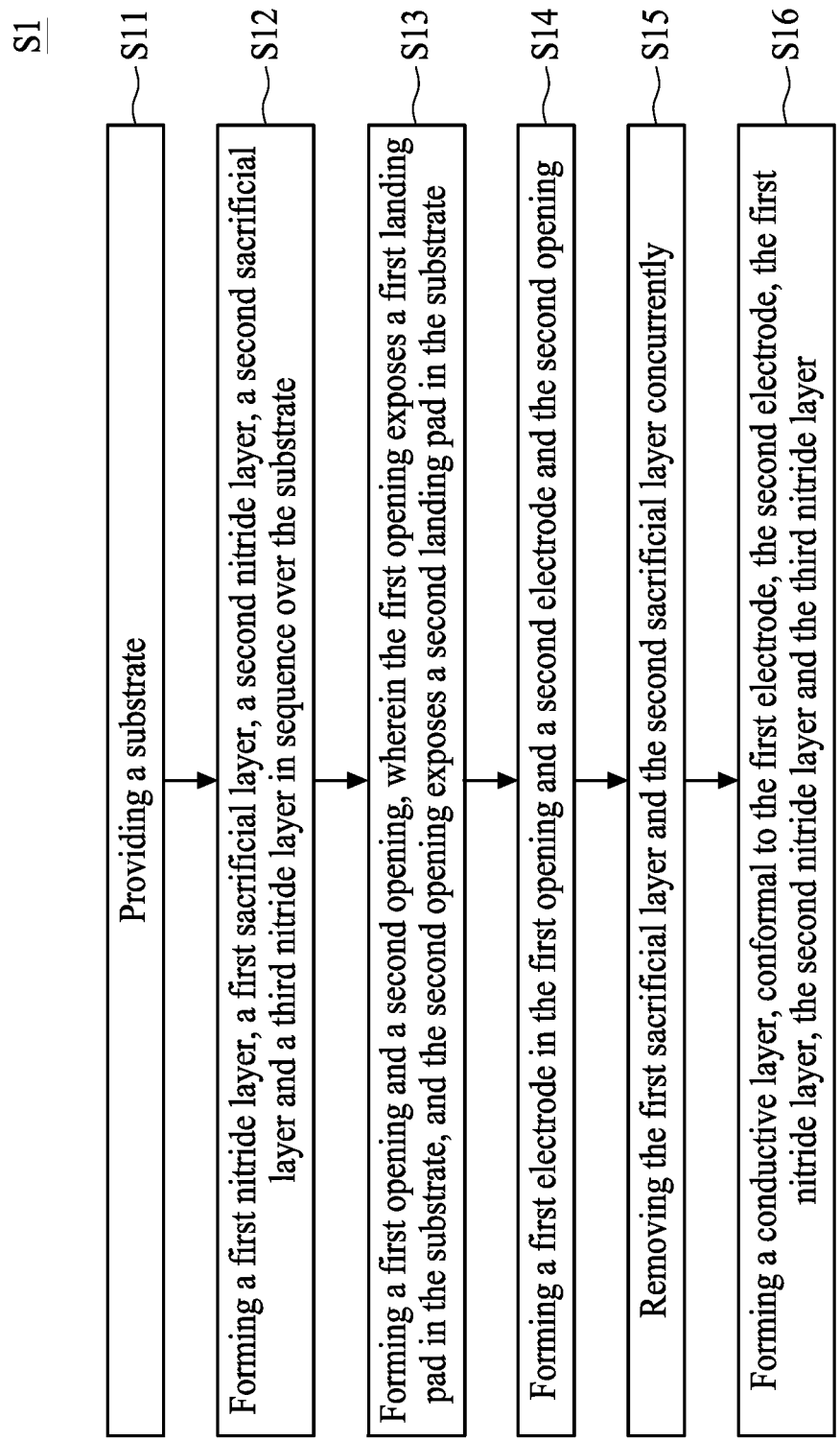
FIG. 2 is a flow diagram illustrating a method of manufacturing a semiconductor structure in accordance with some embodiments of the present disclosure.

FIG. 2 is a flow diagram illustrating a method S1 for manufacturing a semiconductor device in accordance with some embodiments of the present disclosure. The method S1 includes a number of operations (S11, S12, S13, S14, S15 and S16) and the description and illustration are not deemed as a limitation to the sequence of the operations. A substrate is provided in the operation S11. A first nitride layer, a first sacrificial layer, a second nitride layer, a second sacrificial layer and a third nitride layer are formed in sequence over the substrate in the operation S12. A first opening and a second opening are formed in the operation S13, wherein the first opening exposes a first landing pad in the substrate, and a second opening exposes a second landing pad in the substrate. A first electrode is formed in the first opening and a second electrode is formed in the second opening in the operation S14. The first sacrificial layer and the second sacrificial layer are removed concurrently in the operation S15. A conductive layer is formed in the operation S16, wherein the conductive layer is conformal to the first electrode, the second electrode, the first nitride layer, the second nitride layer and the third nitride layer. It should be noted that the operations of the method S1 may be rearranged or otherwise modified within the scope of the various aspects. Additional processes may be provided before, during, and after the method S1, and some other processes may be only briefly described herein. Thus, other implementations are possible within the scope of the various aspects described herein.

In order to further illustrate concepts of the present disclosure, various embodiments are provided below. For a purpose of clarity and simplicity, reference numbers of elements with same or similar functions are repeated in different embodiments. However, such usage is not intended to limit the present disclosure to specific embodiments or specific elements. In addition, conditions or parameters illustrated in different embodiments can be combined or modified to form different combinations of embodiments as long as the parameters or conditions used are not conflicting.

Figure 3:
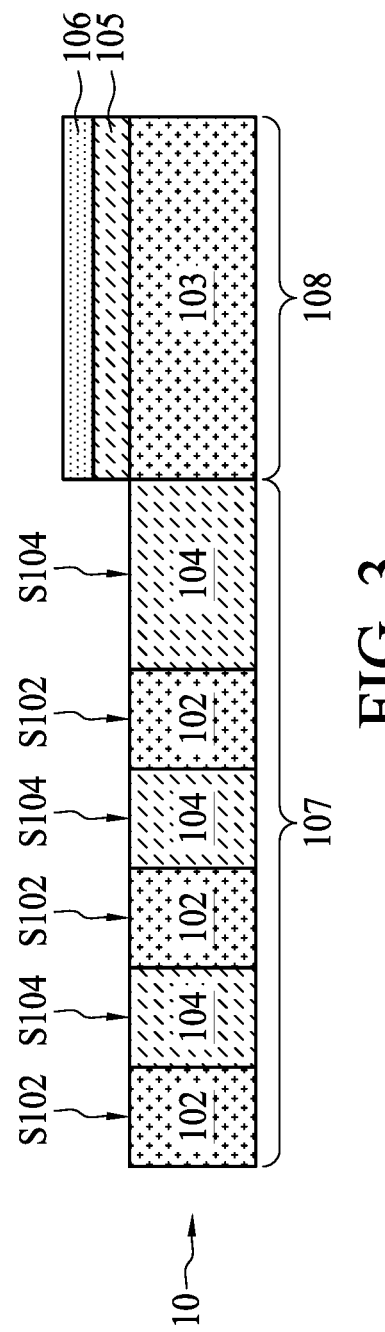
FIGS. 3 to 7 are cross-sectional diagrams of intermediate stages in the formation of a semiconductor structure in accordance with some embodiments of the present disclosure.

Referring to FIG. 3, FIG. 3 is a schematic cross-sectional diagram at a stage of the method S1 in accordance with some embodiments of the present disclosure. In the operation S11, a substrate 10 is provided, formed or received. The substrate 10 can include multiple layers, elements and components formed by common semiconductor manufacturing processes. For ease of illustration and simplicity of drawings, only a top portion of the substrate 10 is depicted in the figures. In some embodiments, the substrate 10 includes one or more landing pads 102 and an insulating layer 104 separating the landing pads 102 in a cell region 107. In some embodiments, top surfaces S102 of the landing pads 102 and a top surface S104 of the insulating layer 104 are exposed.

In some embodiments, the substrate 10 includes the cell region 107 and a peripheral region 108. In some embodiments, active components are disposed mainly in the cell region 107. In some embodiments, the peripheral region 108 surrounding the cell region 107 provides a space for electrical routing between electrical components. In some embodiments, the substrate 10 includes a conductive island 103 in the peripheral region 108 at an elevation same as those of the landing pads 102 and the insulating layer 104. In some embodiments, the substrate 10 includes multiple dielectric layers (e.g., 105 and 106) disposed over the conductive island 103 in the peripheral region 108. In some embodiments, the dielectric layers 105 and 106 are at an elevation higher than those of the landing pads 102. In some embodiments, the top surfaces S102 of the landing pads 102 and the top surface S104 of the insulating layer 104 are exposed at this stage.

Figure 4:
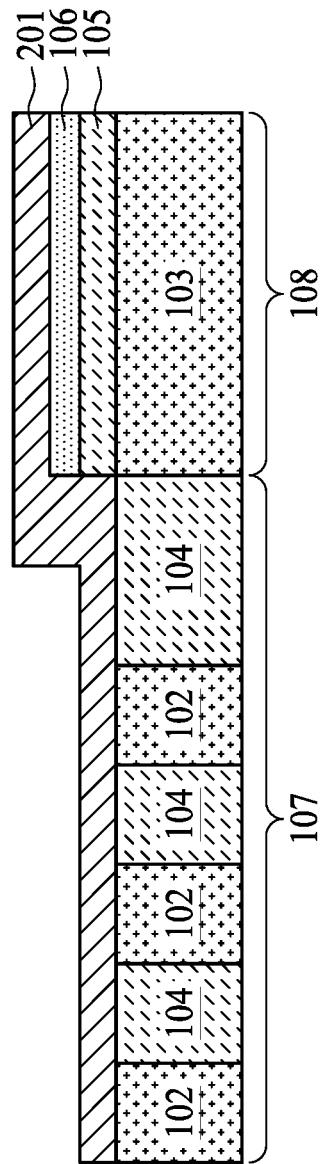

Referring to FIG. 4, FIG. 4 is a schematic cross-sectional diagram at a stage of the method S1 in accordance with some embodiments of the present disclosure. In the operation S12, a first nitride layer 201 is formed over the substrate 10. In some embodiments, the first nitride layer 201 is conformal to the substrate 10. In some embodiments, the first nitride layer 201 includes silicon nitride ($Si_xN_y$), silicon oxynitride (SiON), a low-k dielectric material, combinations thereof, and/or other suitable materials. The low-k dielectric material may have a dielectric constant (k value) less than 3.9. In some embodiments, the first nitride layer 201 includes silicon nitride. In some embodiments, the first nitride layer 201 is formed by a deposition operation. In some embodiments, the deposition operation include a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof. In some embodiments, the first nitride layer 201 is formed in the cell region 107 and the peripheral region 108. In some embodiments, the first nitride layer 201 has a stepped profile, wherein a portion of the first nitride layer 201 in the peripheral region 108 is at an elevation higher than that of a portion of the first nitride layer 201 in the cell region 107.

Figure 5:
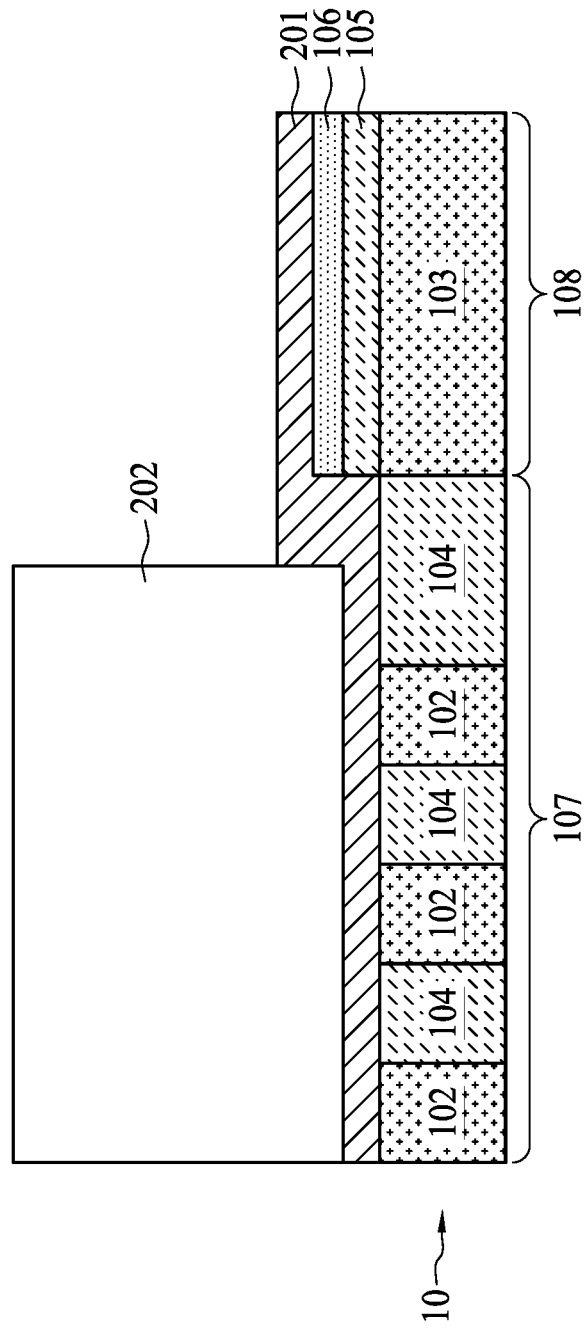

Referring to FIG. 5, FIG. 5 is a schematic cross-sectional diagram at a stage of the method S1 in accordance with some embodiments of the present disclosure. In the operation S12, a first sacrificial layer 202 is formed over the first nitride layer 201. In some embodiments, the first sacrificial layer 202 is formed only in the cell region 107. In some embodiments, the first sacrificial layer 202 is formed in the cell region 107 and the peripheral region 108, and a portion of the first sacrificial layer 202 in the peripheral region 108 is omitted in the figures for a purpose of simplicity. In some embodiments, the first sacrificial layer 202 at least covers the top surfaces S102 of the landing pads 102. In some embodiments, the first sacrificial layer 202 includes silicate glass, silicon oxide, silane oxide, or a combination thereof. In some embodiments, the first sacrificial layer 202 includes borophosilicate glass (BPSG). In some embodiments, the first sacrificial layer 202 includes a dielectric material different from that of the first nitride layer 201 for a purpose of selective etching.

Figure 6:
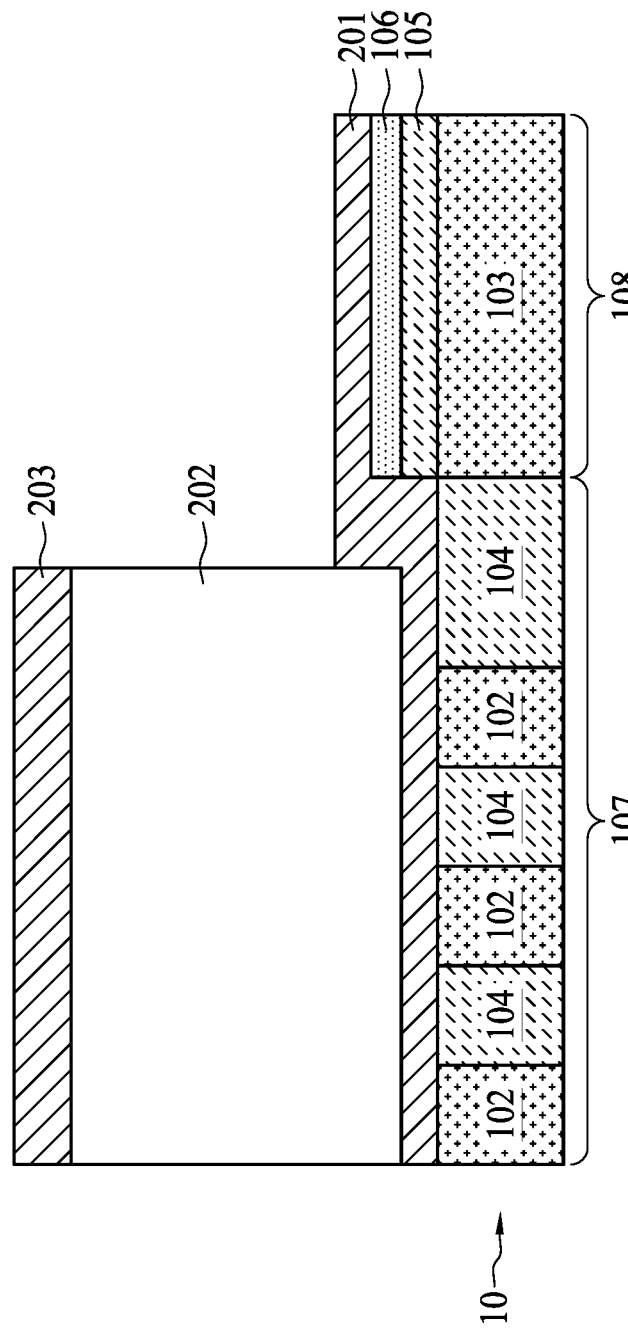

Referring to FIG. 6, FIG. 6 is a schematic cross-sectional diagram at a stage of the method S1 in accordance with some embodiments of the present disclosure. In the operation S12, a second nitride layer 203 is formed over the first sacrificial layer 202. In some embodiments, the second nitride layer 203 is formed only in the cell region 107. In some embodiments, the second nitride layer 203 is formed in the cell region 107 and the peripheral region 108, and a portion of the second nitride layer 203 is the peripheral region 108 is omitted in the figures for a purpose of simplicity. Similarly, elements formed later in the process may be formed only in the cell region 107 or formed in both the cell region 107 and the peripheral region 108 but only portions in the cell region 107 are shown for a purpose of simplicity of the figures. Arrangement of the elements can be adjusted according to different applications. Repeated illustration is omitted hereafter in the specification. In some embodiments, a material of the second nitride layer 203 is the same as that of the first nitride layer 201. In some embodiments, the second nitride layer 203 is formed by a deposition operation. In some embodiments, the deposition operation includes a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof.

Figure 7:
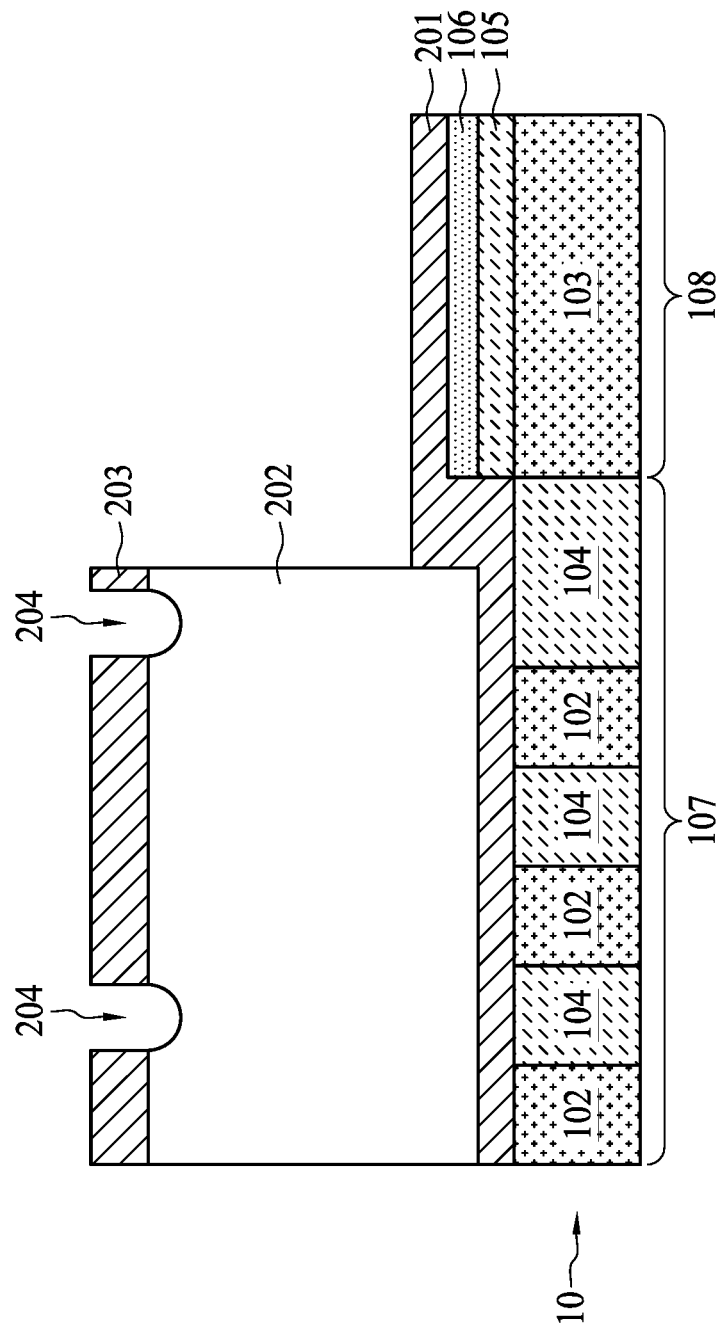

Referring to FIG. 7, FIG. 7 is a schematic cross-sectional diagram at a stage of the method S1 in accordance with some embodiments of the present disclosure. In the operation S12, after the formation of the second nitride layer 203, one or more portions of the second nitride layer 203 are removed, and at least a portion of the first sacrificial layer 202 is thereby exposed. In some embodiments, a plurality of openings 204 are formed on the second nitride layer 203 by an etching operation. In some embodiments, the etching operation includes a wet etching operation, a dry etching operation, a directional dry etching operation, or a combination thereof. In some embodiments, a portion of the first sacrificial layer 202 is also removed by the etching operation.

Figure 8:
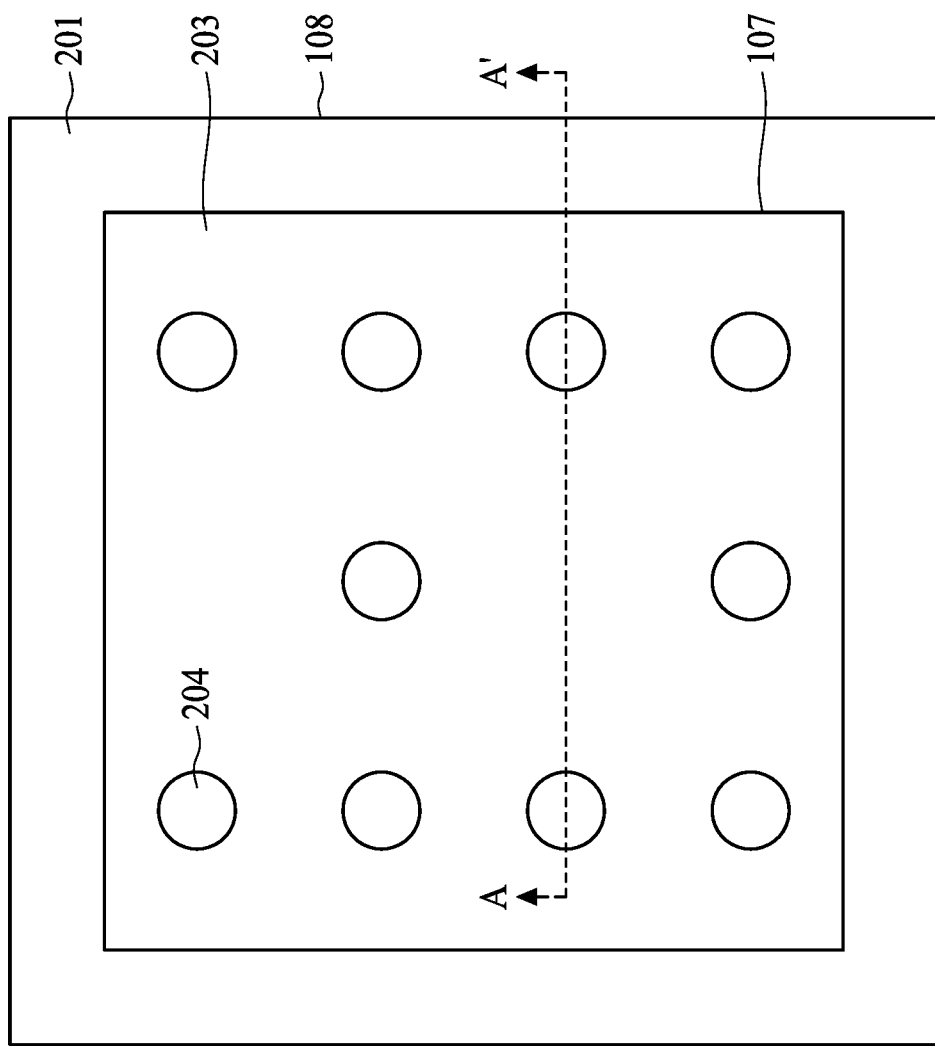
FIG. 8 is a schematic top view of the intermediate structure shown in FIG. 7 in accordance with some embodiments of the present disclosure.

Referring to FIG. 8, FIG. 8 is a schematic top view of the second nitride layer 203 at the stage shown in FIG. 7 in accordance with some embodiments of the present disclosure. In some embodiments, FIG. 7 is the cross-sectional diagram along a line A-A' in FIG. 8. A configuration of each of the openings 204 can be a circle as shown in FIG. 8. However, the disclosure is not limited thereto. In other embodiments, a configuration of an opening 204 can be a square, a rectangle, a triangle, a hexagon, or another polygon. In some embodiments, all of the openings 204 are circular from the top view perspective as shown in FIG. 8 for a purpose of simplicity of manufacturing. In other embodiments, different openings 204 have different configurations from a top view perspective. The formation of the openings 204 is for a purpose of concurrent removal of sacrificial layers above and below the second nitride layer 203 (detailed illustration is provided in the following specification), and thus a number and arrangement of the openings 204 are not limited herein as long as the sacrificial layers can be connected. The arrangement of the openings 204 shown in FIG. 8 represents an exemplary embodiment, and is not intended to limit the present disclosure.

Figure 9:
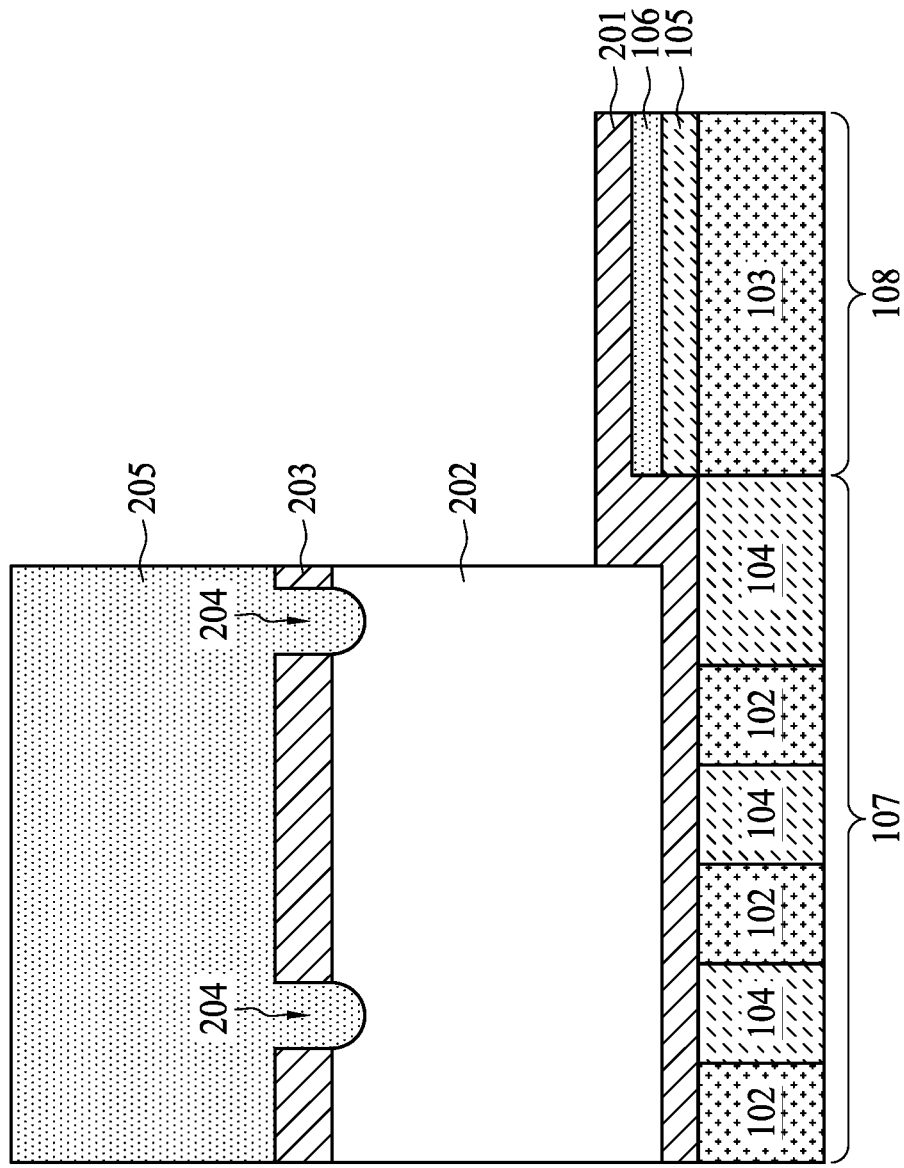
FIGS. 9 to 17 are cross-sectional diagrams of intermediate stages in the formation of a semiconductor structure in accordance with some embodiments of the present disclosure.

Referring to FIG. 9, FIG. 9 is a schematic cross-sectional diagram at a stage of the method S1 in accordance with some embodiments of the present disclosure. In the operation S12, after the formation of the openings 204, a second sacrificial layer 205 is formed over the second nitride layer 203. In some embodiments, the second sacrificial layer 205 fills the openings 204 and penetrates the second nitride layer 203. In some embodiments, the second sacrificial layer 205 contacts the first sacrificial layer 202. In some embodiments, the second sacrificial layer 205 includes a dielectric material. The first sacrificial layer 202 and the second sacrificial layer 205 may include same or different materials. In some embodiments, the dielectric material of the second sacrificial layer 205 is the same as a dielectric material of the first sacrificial layer 202. In some embodiments, the first sacrificial layer 202 and the second sacrificial layer 205 both include oxide. In some embodiments, the second sacrificial layer 205 includes silane oxide.

Figure 10:
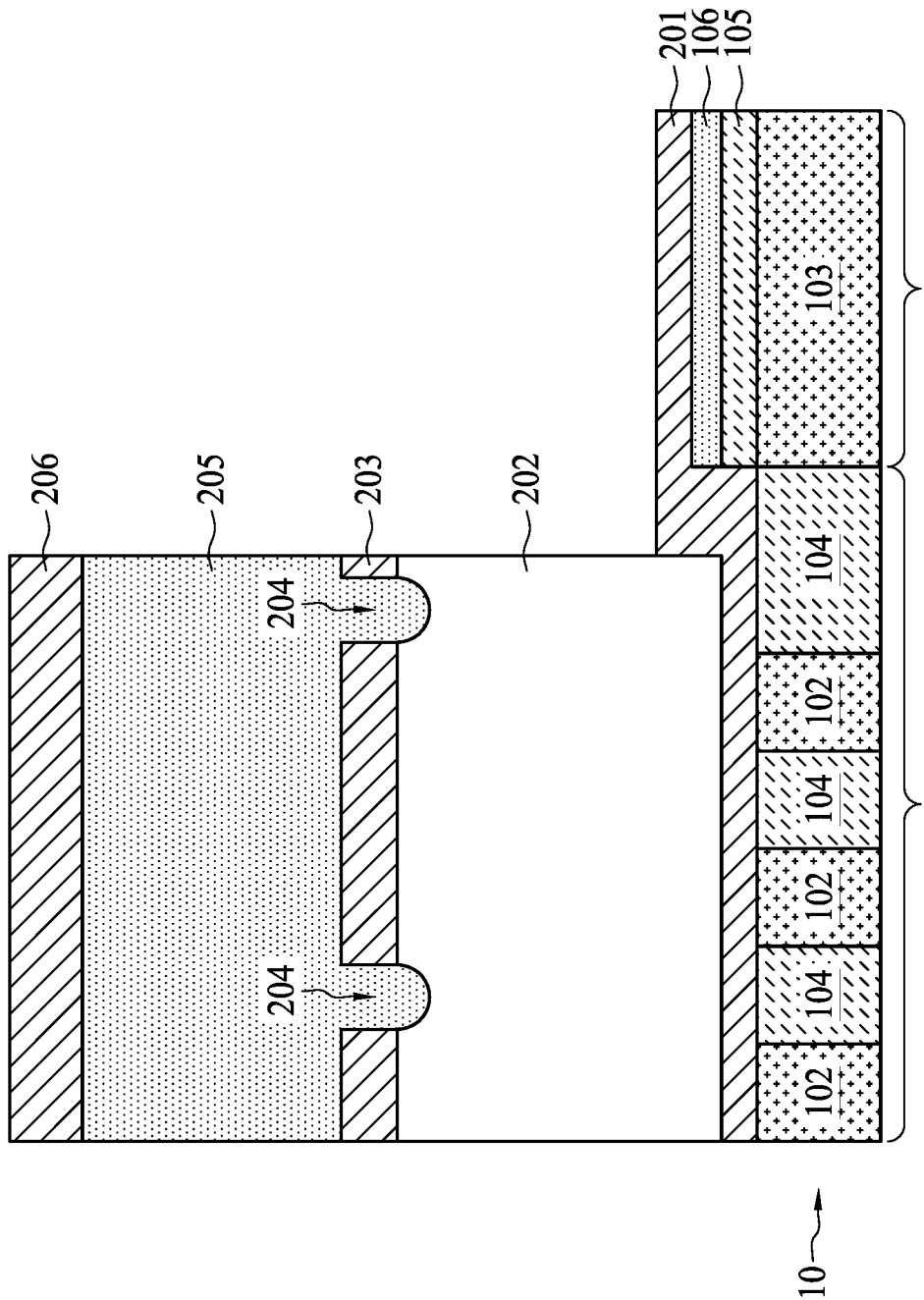

Referring to FIG. 10, FIG. 10 is a schematic cross-sectional diagram at a stage of the method S1 in accordance with some embodiments of the present disclosure. In the operation S12, after the formation of the second sacrificial layer 205, a third nitride layer 206 is formed over the second sacrificial layer 205. In some embodiments, a material of the third nitride layer 206 is the same as that of the second nitride layer 203. In some embodiments, the third nitride layer 206 includes silicon nitride. In some embodiments, the third nitride layer 206 is formed by a deposition operation. In some embodiments, the deposition operation includes a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof.

Figure 11:
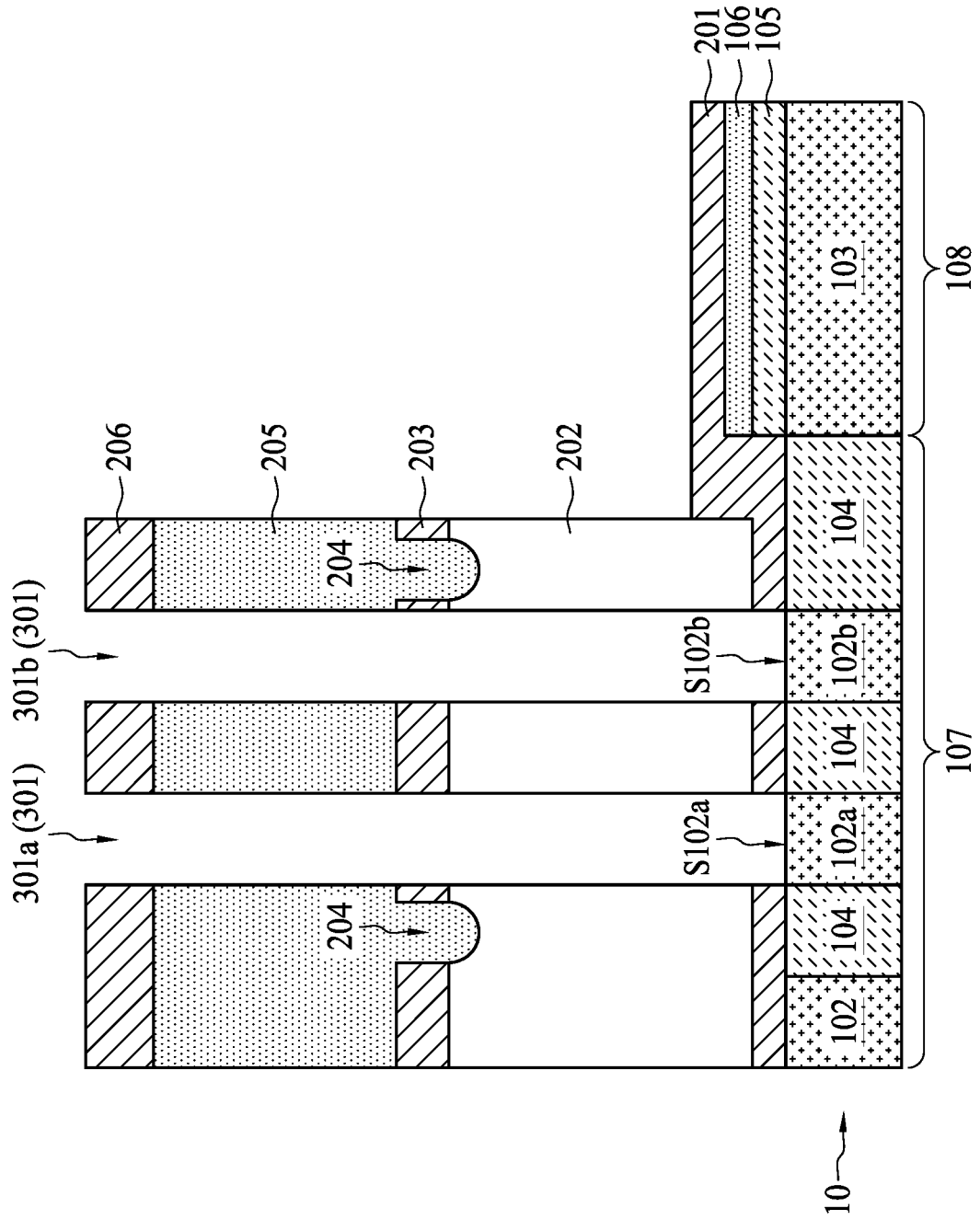

Referring to FIG. 11, FIG. 11 is a schematic cross-sectional diagram at a stage of the method S1 in accordance with some embodiments of the present disclosure. In the operation S13, a plurality of openings 301 are formed. In some embodiments, each of the openings 301 penetrates the third nitride layer 206, the second sacrificial layer 205, the second nitride layer 203, the first sacrificial layer 202 and the first nitride layer 201. In some embodiments, the openings 301 are formed by one or more etching operations. In some embodiments, the etching operations include a selective wet etching, a direction dry etching, an ion beam etching, a reactive ion etching, or a combination thereof. In some embodiments, each of the openings 301 exposes a landing pad 102 in the substrate 10. FIG. 11 shows that the openings 301, including a first opening 301a and a second opening 301b, expose two adjacent landing pads 102 as an exemplary embodiment. In other embodiments, a number of the openings 301 can be greater than 2, and the landing pads 102 exposed by the openings 301 may not be adjacent. For a purpose of illustration, the landing pad exposed through the first opening 301a is labelled as 102a, and the landing pad exposed through the second opening 301b is labelled as 102b in the figures hereinafter. In some embodiments, the first opening 301a exposes an entirety of a top surface S102a of the landing pad 102a. In some embodiments, the second opening 301b exposes an entirety of a top surface S102b of the landing pad 102b.

Figure 12:
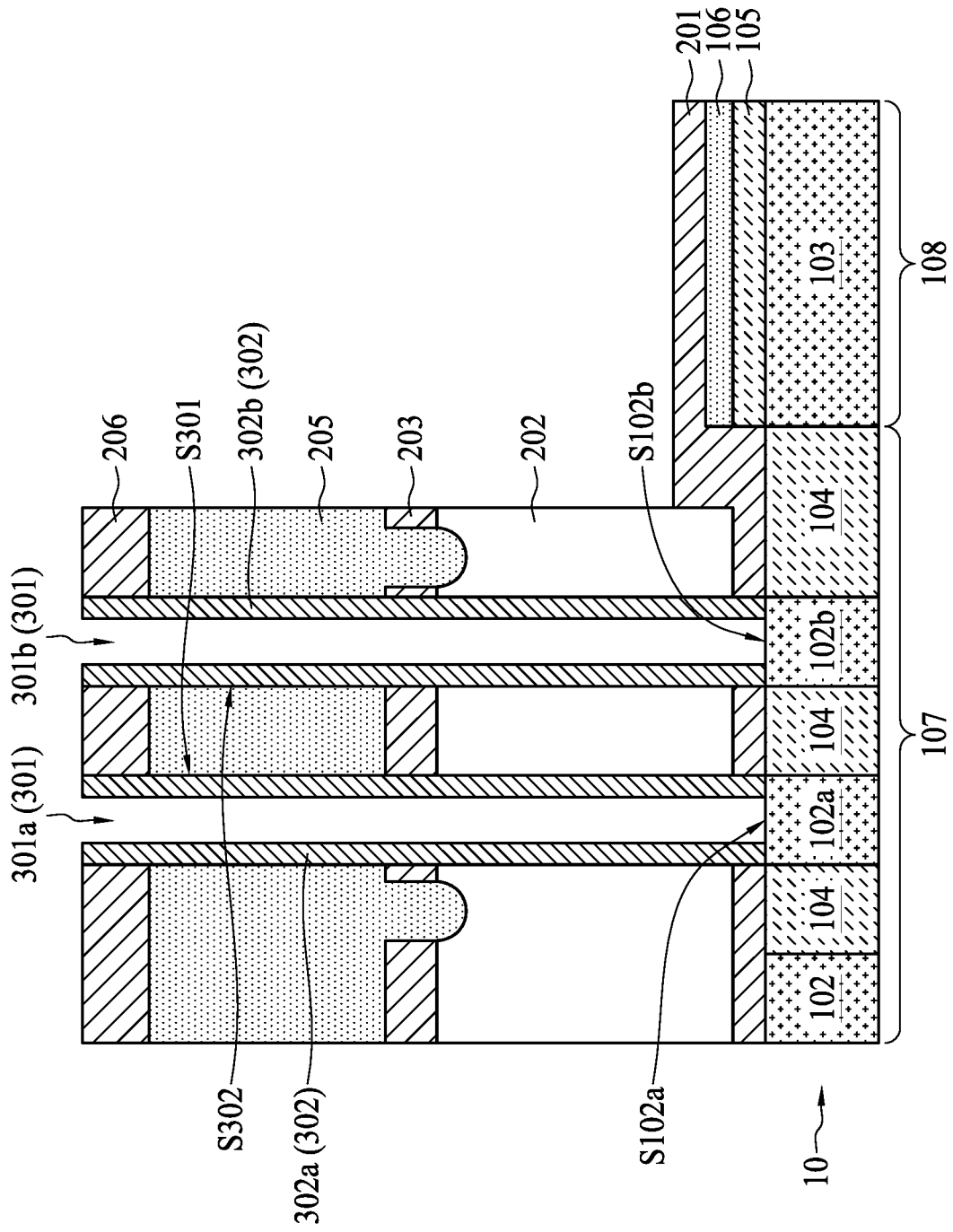

Referring to FIG. 12, FIG. 12 is a schematic cross-sectional diagram at a stage of the method S1 in accordance with some embodiments of the present disclosure. After the operation S13, dielectric layers 302 are formed in each of the openings 301. In some embodiments, the dielectric layers 302 include a same material. In some embodiments, the dielectric layers 302 include one or more high-k materials. In some embodiments, the high-k dielectric material has a dielectric constant (k value) greater than 3.9. The high-k dielectric material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$), silicates of one or more of $ZrO_2$, $HfO_2$, $Al_2O_3$, $Y_2O_3$ and $La_2O_3$, aluminates of one or more of $ZrO_2$, $HfO_2$, $Y_2O_3$ and $La_2O_3$, another applicable material, or a combination thereof. Other suitable materials are within the contemplated scope of this disclosure.

In some embodiments, the dielectric layers 302 include a first dielectric layer 302a lining sidewalls of the first opening 301a and a second dielectric layer 302b lining sidewalls of the second opening 301b. In some embodiments, a portion of the top surface S102a of the landing pad 102a is exposed through the first dielectric layer 302a. In some embodiments, a portion of the top surface S102b of the landing pad 102b is exposed through the second dielectric layer 302b. In some embodiments, an entirety of the first dielectric layer 302a is disposed within the first opening 301a. In some embodiments, an entirety of the second dielectric layer 302b is disposed within the second opening 301b.

Figure 13:
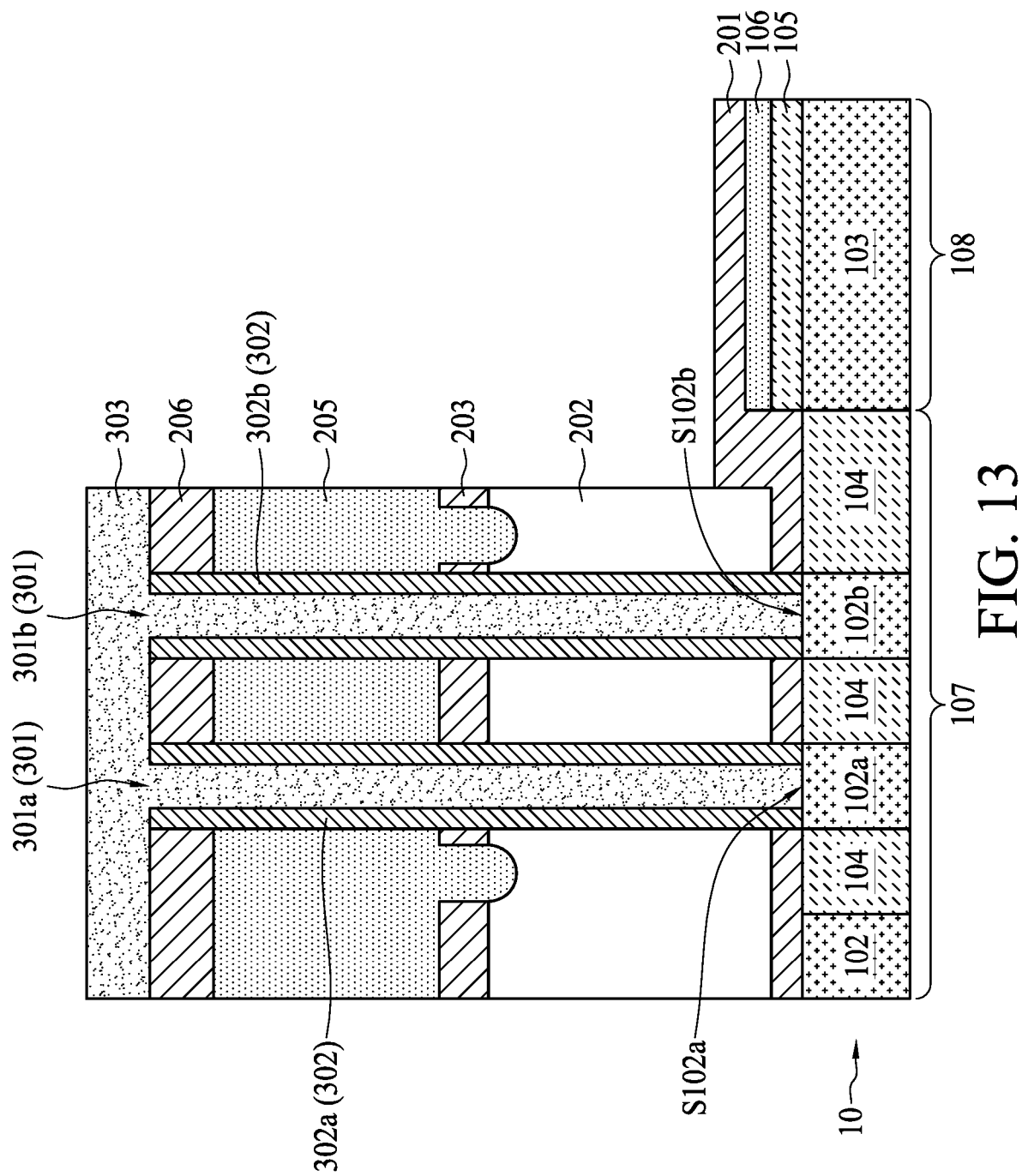

Referring to FIG. 13, FIG. 13 is a schematic cross-sectional diagram at a stage of the method S1 in accordance with some embodiments of the present disclosure. After the formation of the dielectric layers 302, a conductive layer 303 is formed in the openings 301. In some embodiments, the conductive layer 303 fills the openings 301 and covers the third nitride layer 206. In some embodiments, the conductive layer 303 contacts the top surfaces S102a and S102b of the landing pads 102a and 102b. In some embodiments, the conductive layer 303 includes metallic material, such as aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), or other suitable materials. The conductive layer 303 can be formed by low-pressure chemical vapor deposition (LPCVD), plasma-enhanced CVD (PECVD), an electron-beam physical vapor deposition (EBPVD), a sputtering operation, an electroplating operation, a screen printing operation, or another suitable method.

Figure 14:
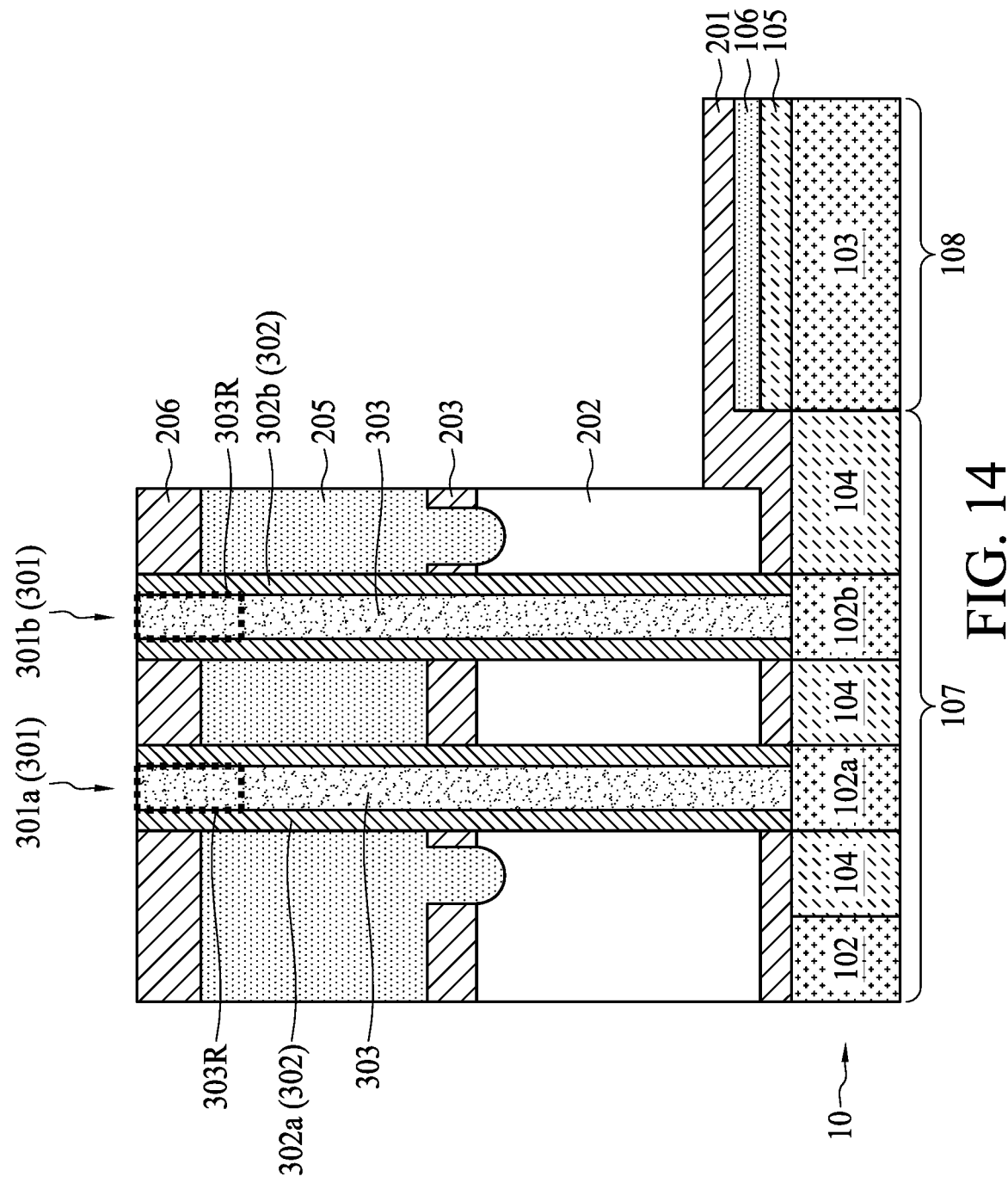

Referring to FIG. 14, FIG. 14 is a schematic cross-sectional diagram at a stage of the method S1 in accordance with some embodiments of the present disclosure. After the formation of the conductive layer 303, a portion of the conductive layer 303 is removed. In some embodiments, the portion of the conductive layer 303 disposed above the third nitride layer 206 is removed. In some embodiments, the removal of the portion of the conductive layer 303 includes ion beam etching, directional dry etching, reactive ion etching, solution wet etching, chemical mechanical polishing (CMP), or a combination thereof. In some embodiments, portions of the conductive layer 303 in the openings 301 remain in place after the removal. In some embodiments, top surfaces of the third nitride layer 206, the dielectric layers 302, and the remaining portions of the conductive layer 303 in the openings 301a and 301b are coplanar.

Figure 15:
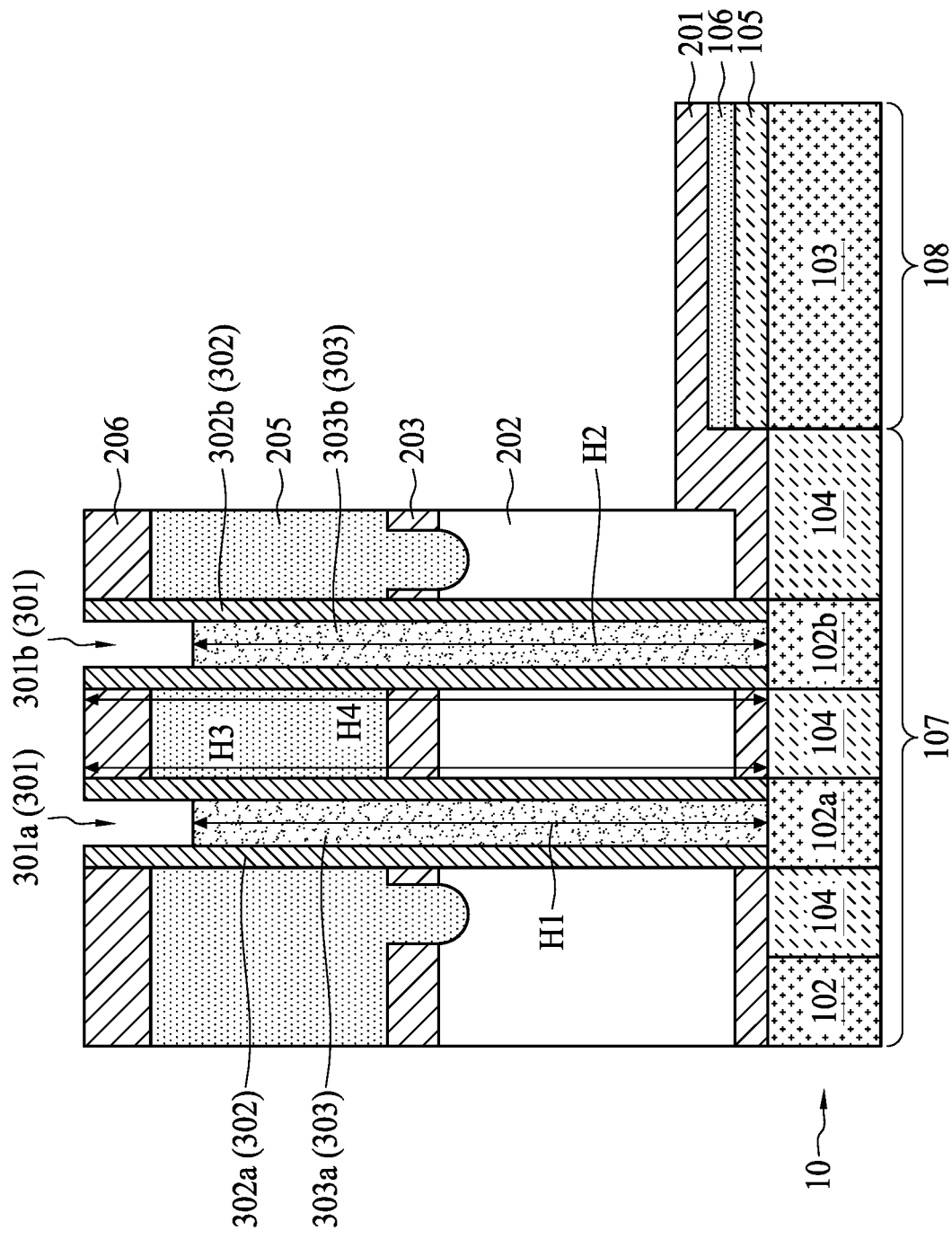

Referring to FIG. 15, FIG. 15 is a schematic cross-sectional diagram at a stage of the method S1 in accordance with some embodiments of the present disclosure. In the operation S14, the remaining portions of the conductive layer 303 in the openings 301 are partially removed, and thereby a first electrode 303a and a second electrode 303b are formed in the first opening 301a and the second opening 301b, respectively. In some embodiments, an etch-back operation is performed on the remaining portions of the conductive layer 303. In some embodiments, top portions 303R of the remaining portions of the conductive layer 303 disposed in the openings 301 (indicated in dash lines in FIG. 14) are removed, and the conductive layer 303 left behind in the openings 301 becomes the first electrode 303a in the first opening 301a and the second electrode 303b in the second opening 301b.

In some embodiments, the first electrode 303a is disposed over and extends vertically away from the landing pad 102a. In some embodiments, the first dielectric layer 302a surrounds the first electrode 303a in the first opening 301a. In some embodiments, the first electrode 303a is entirely below the third nitride layer 206. In some embodiments, a height H3 of the first dielectric layer 302a is greater than a height H1 of the first electrode 303a. In some embodiments, the second electrode 303b is disposed over and extends vertically away from the landing pad 102b. In some embodiments, the second dielectric layer 302b surrounds the second electrode 303b in the second opening 301b. In some embodiments, the second electrode 303b is entirely below the third nitride layer 206. In some embodiments, a height H4 of the second dielectric layer 302b is greater than a height H2 of the second electrode 303b.

Figure 16:
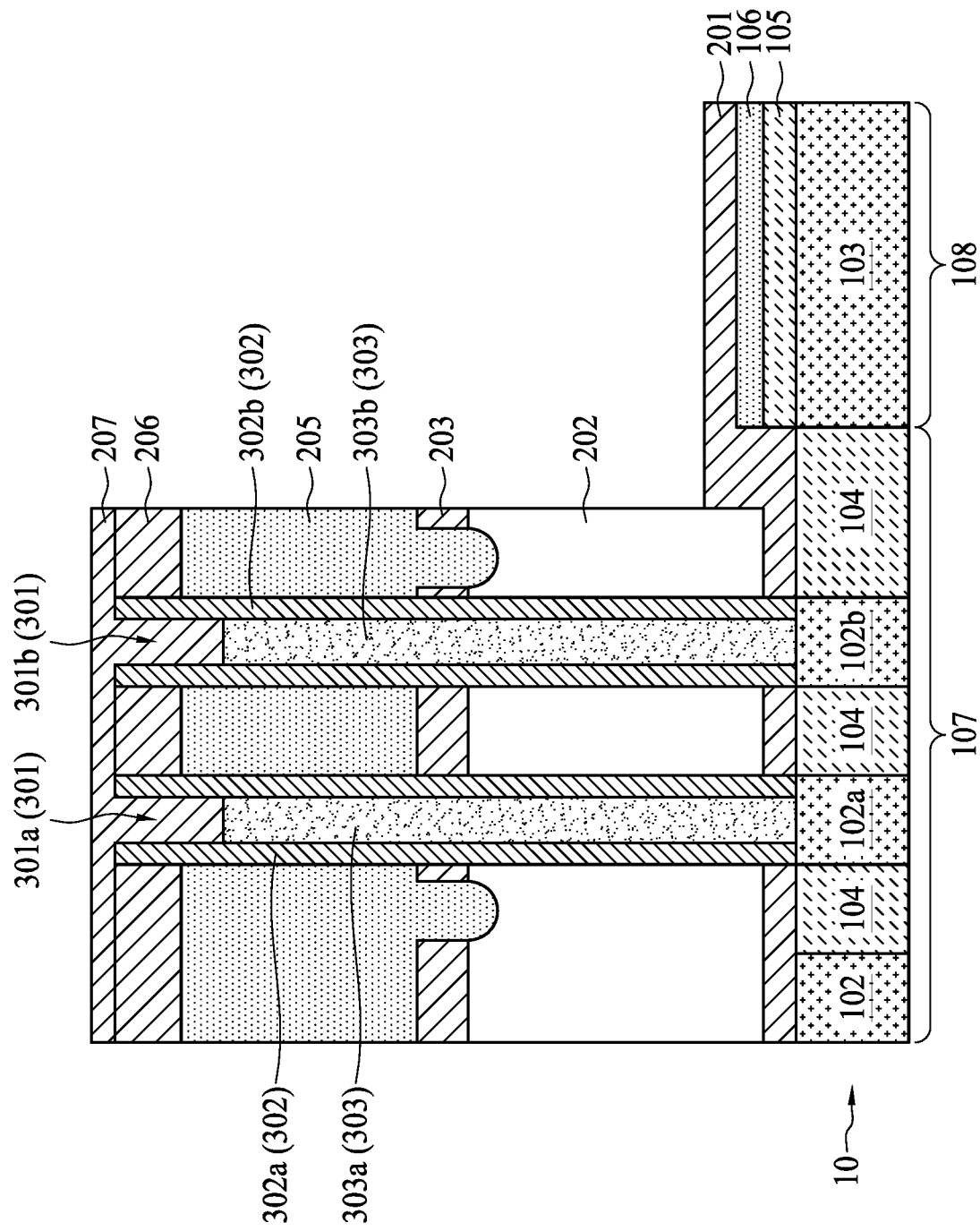

Referring to FIG. 16, FIG. 16 is a schematic cross-sectional diagram at a stage of the method S1 in accordance with some embodiments of the present disclosure. After the formation of the first electrode 303a and the second electrode 303b, a fourth nitride layer 207 is formed over the third nitride layer 206. In some embodiments, the fourth nitride layer 207 includes a same material as the third nitride layer 206. In some embodiments, an interface between the third nitride layer 206 and the fourth nitride layer 207 may not be observed. In some embodiments, the fourth nitride layer 207 fills the openings 301 above the first electrode 303a and the second electrode 303b. In some embodiments, a portion of the fourth nitride layer 207 is disposed above the third nitride layer 206. In some embodiments, a portion of the fourth nitride layer 207 protrudes toward the first electrode 303a, and the portion of the fourth nitride layer 207 is surrounded by the first dielectric layer 302a. In some embodiments, a portion of the fourth nitride layer 207 protrudes toward the second electrode 303b, and the portion of the fourth nitride layer 207 is surrounded by the second dielectric layer 302b. The fourth nitride layer 207 may function as an electrical insulator between different electrodes of a capacitor (detailed illustration of such a configuration is provided later). In some embodiments, the fourth nitride layer 207 is formed by a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof.

Figure 17:
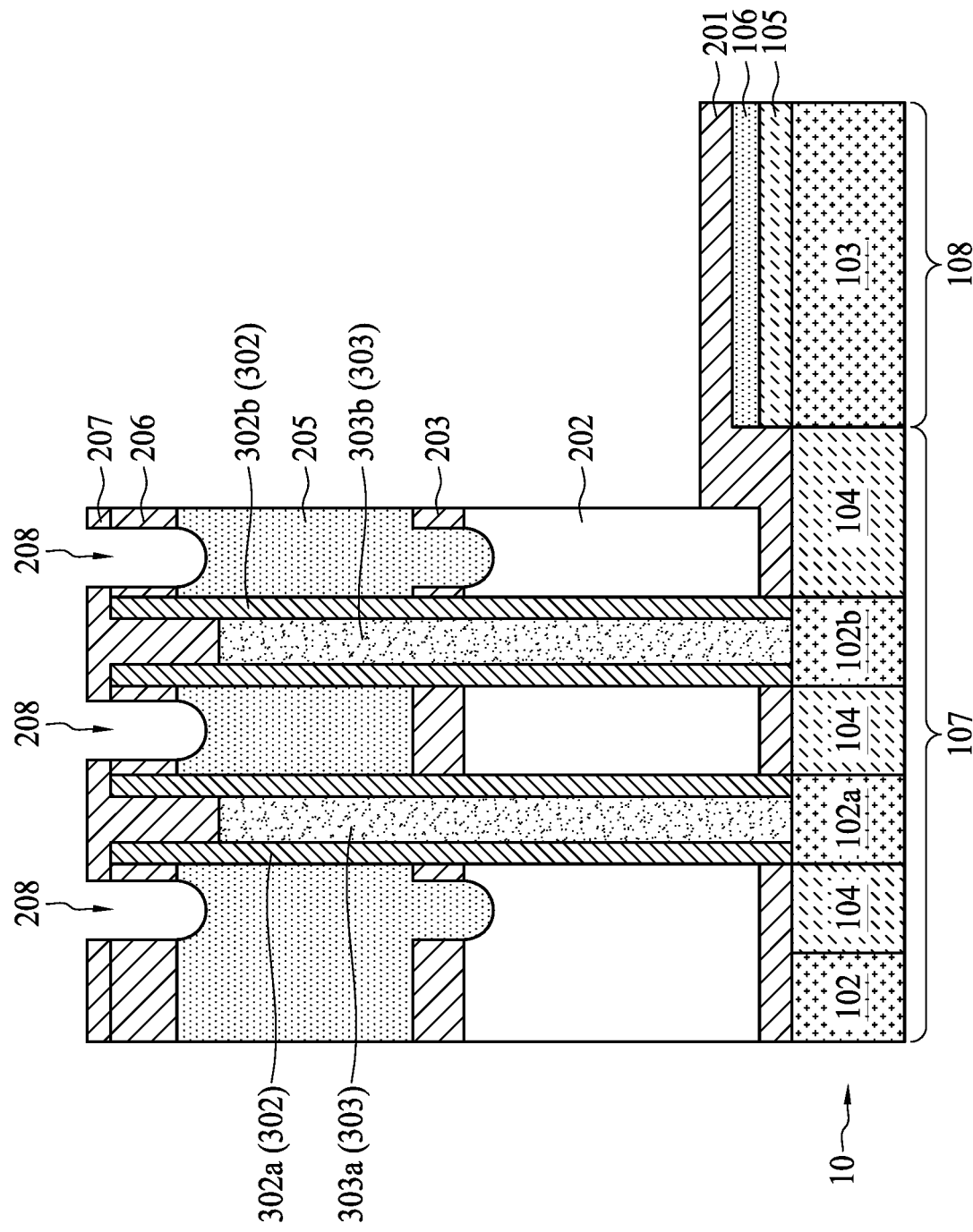

Referring to FIG. 17, FIG. 17 is a schematic cross-sectional diagram at a stage of the method S1 in accordance with some embodiments of the present disclosure. After the formation of the fourth nitride layer 207, at least a portion of the second sacrificial layer 205 is exposed. In some embodiments, one or more etching operations are performed to form a plurality of openings 208 penetrating the third nitride layer 206 and portions of the fourth nitride layer 207 covering the portion(s) of the second sacrificial layer 205. In some embodiments, some of the openings 208 are formed between the openings 301. In some embodiments, one or more etching operations are performed on the fourth nitride layer 207 and the third nitride layer 206 to expose the second sacrificial layer 205 at the openings 208. In some embodiments, portions of the third nitride layer 206 and portions the fourth nitride layer 207 are removed by different etching operations. In some embodiments, the portions of the third nitride layer 206 and the portions of the fourth nitride layer 207 are removed concurrently by one etching operation. In some embodiments, the one or more etching operations include a wet etching operation, a dry etching operation, a directional dry etching operation, or a combination thereof. In some embodiments, portions of the second sacrificial layer 205 at the openings 208 are also removed by the one or more etching operations. In some embodiments, a configuration and arrangement of the openings 208 from a top view perspective can be similar to or different from those of the openings 204.

Figure 18:
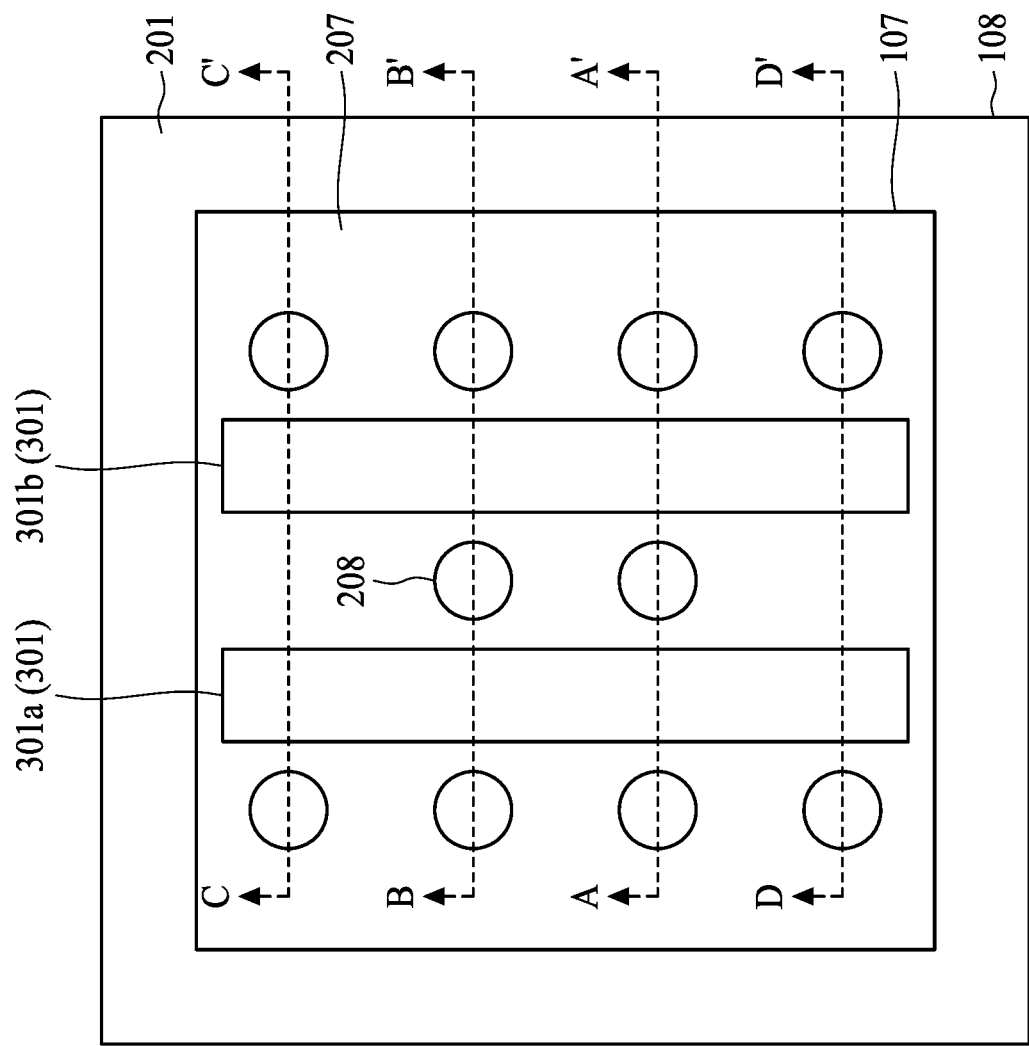
FIG. 18 is a schematic top view of the intermediate structure shown in FIG. 17 in accordance with some embodiments of the present disclosure.

Referring to FIG. 18, FIG. 18 is a schematic top view of the fourth nitride layer 207 at the stage shown in FIG. 17 in accordance with some embodiments of the present disclosure. In some embodiments, FIG. 17 is the cross-sectional diagram along the line A-A' in FIG. 18. A configuration of each of the openings 208 can be a circle as shown in FIG. 18, but the disclosure is not limited thereto. The formation of the openings 208 is for a purpose of exposure of the second sacrificial layer 205 to a wet etching operation (detailed illustration is provided below), and thus a number and an arrangement of the openings 208 are not limited herein as long as the second sacrificial layer 205 can be exposed.

Figure 19:
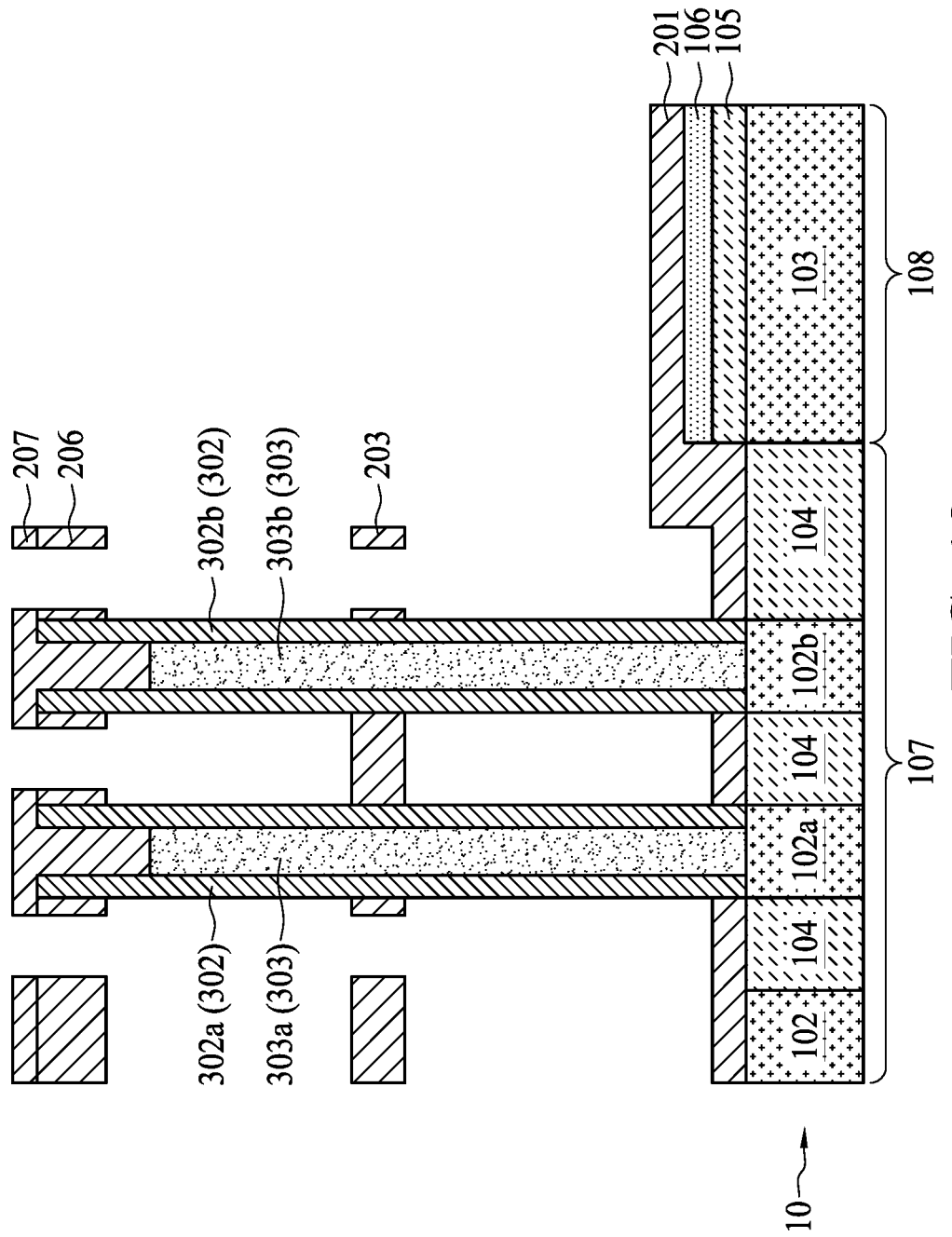
FIGS. 19 to 21 are cross-sectional diagrams of intermediate stages in the formation of a semiconductor structure in accordance with some embodiments of the present disclosure.

Referring to FIG. 19, FIG. 19 is a schematic cross-sectional diagram at a stage of the method S1 in accordance with some embodiments of the present disclosure. In the operation S15, the first sacrificial layer 202 and the second sacrificial layer 205 are concurrently removed. In some embodiments, a wet etching operation is performed to remove the first sacrificial layer 202 and the second sacrificial layer 205 concurrently. In some embodiments, an etchant of the wet etching operation having a low selectivity between the first sacrificial layer 202 and the second sacrificial layer 205 is used so as to remove the first sacrificial layer 202 and the second sacrificial layer 205 concurrently. In some embodiments, the etchant of the wet etching operation has a high selectivity between the sacrificial layers (205 and 202) and the nitride layers (201, 203, 206 and 207). In some embodiments, the etchant of the wet etching operation has a high selectivity between the sacrificial layers (205 and 202) and the dielectric layers (302). In some embodiments, the etchant has low removal rates to the nitride layers 201, 203, 206 and 207 and the dielectric layers 302. In some embodiments, the removal rates of the etchant on the nitride layers 201, 203, 206 and 207 and the dielectric layers 302 is very low and can be ignored. The nitride layers 201, 203, 206 and 207 remain attached to and provide support to the dielectric layers 302 and the electrodes 303a and 303b.

The presence of the openings 208 penetrating the nitride layers 207 and 206 provides passages for the etchant to react with the sacrificial layer 205, and the presence of the openings 204 penetrating the second nitride layer 203 provides passages for the etchant to react with the first sacrificial layer 202. In order to effectively remove the sacrificial layers 202 and 205 between the openings 301a and 301b, at least some of the openings 208 and some of the openings 204 are arranged between the openings 301a and 301b. Theoretically, greater numbers of the openings 208 and the openings 204 can give better removal rates of the sacrificial layers 202 and 205. However, an excessive number of the openings 208 can result in damage or failure of the nitride layers 206 and 207 after the removal of the second sacrificial layer 205. Similarly, an excessive number of the openings 204 can result in damage or failure of the nitride layer 203 after the removal of the first sacrificial layer 202. Therefore, numbers and arrangements of the openings 208 and the openings 204 can be adjusted and optimized depending on different applications, and are not limited herein.

Figure 20:
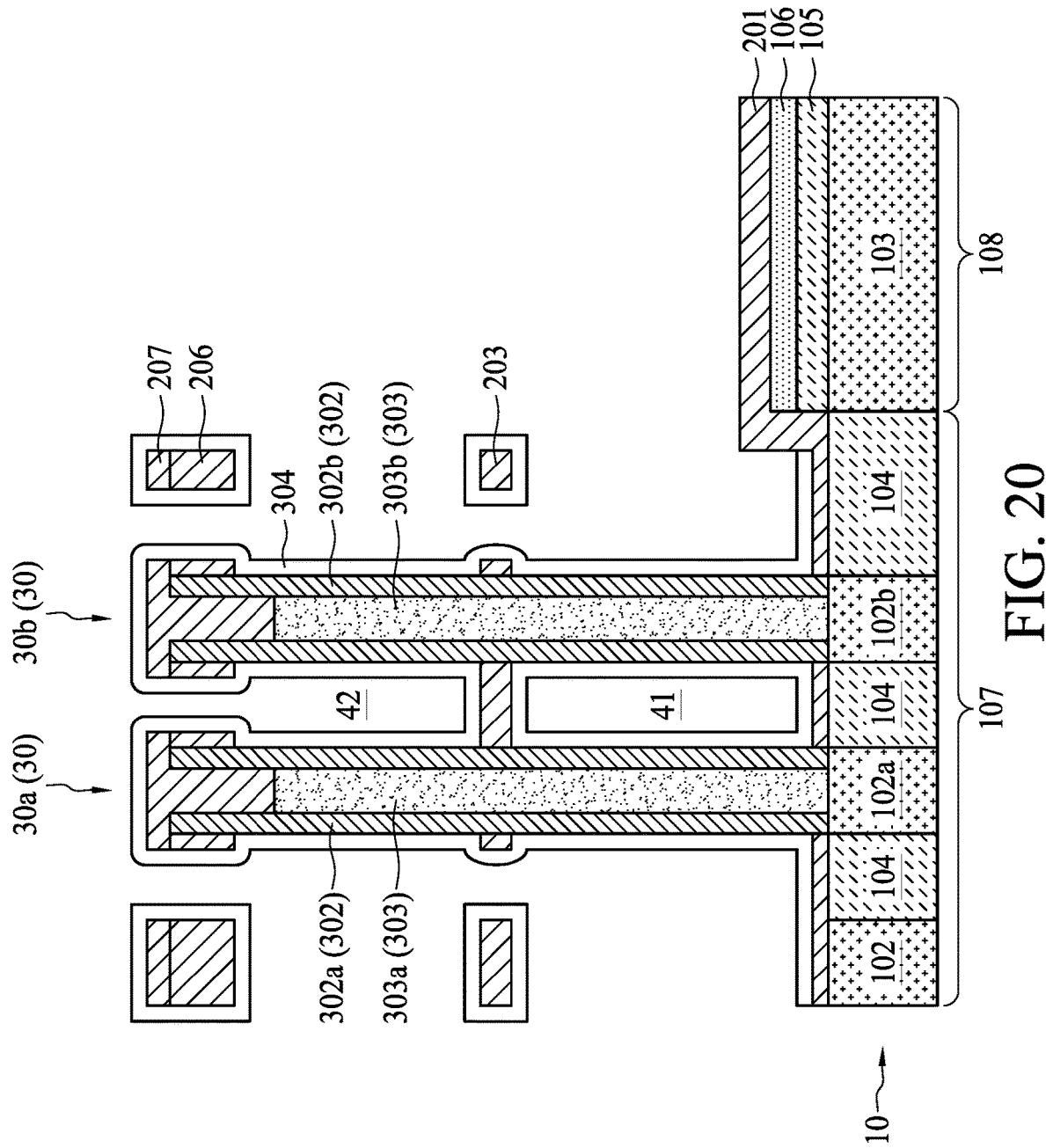

Referring to FIG. 20, FIG. 20 is a schematic cross-sectional diagram at a stage of the method S1 in accordance with some embodiments of the present disclosure. In the operation S16, a conductive layer 304 is formed over the substrate 10. In some embodiments, the conductive layer 304 is conformal to the first nitride layer 201, the second nitride layer 203, the third nitride layer 206, the fourth nitride layer 207, and the dielectric layers 302. In some embodiments, the conductive layer 304 surrounds the dielectric layer 302a and the first electrode 303a. In some embodiments, the conductive layer 304 surrounds the dielectric layer 302b and the second electrode 303b. A first gap 41 may be defined between the dielectric layers 302a and 302b and disposed below the second nitride layer 203. A second gap 42 may be defined between the dielectric layers 302a and 302b and disposed above the second nitride layer 203. The conductive layer 304 can be formed by low-pressure chemical vapor deposition (LPCVD), plasma-enhanced CVD (PECVD), an electron-beam physical vapor deposition (EBPVD), a sputtering operation, an electroplating operation, a screen printing operation, or another suitable method.

Figure 21:
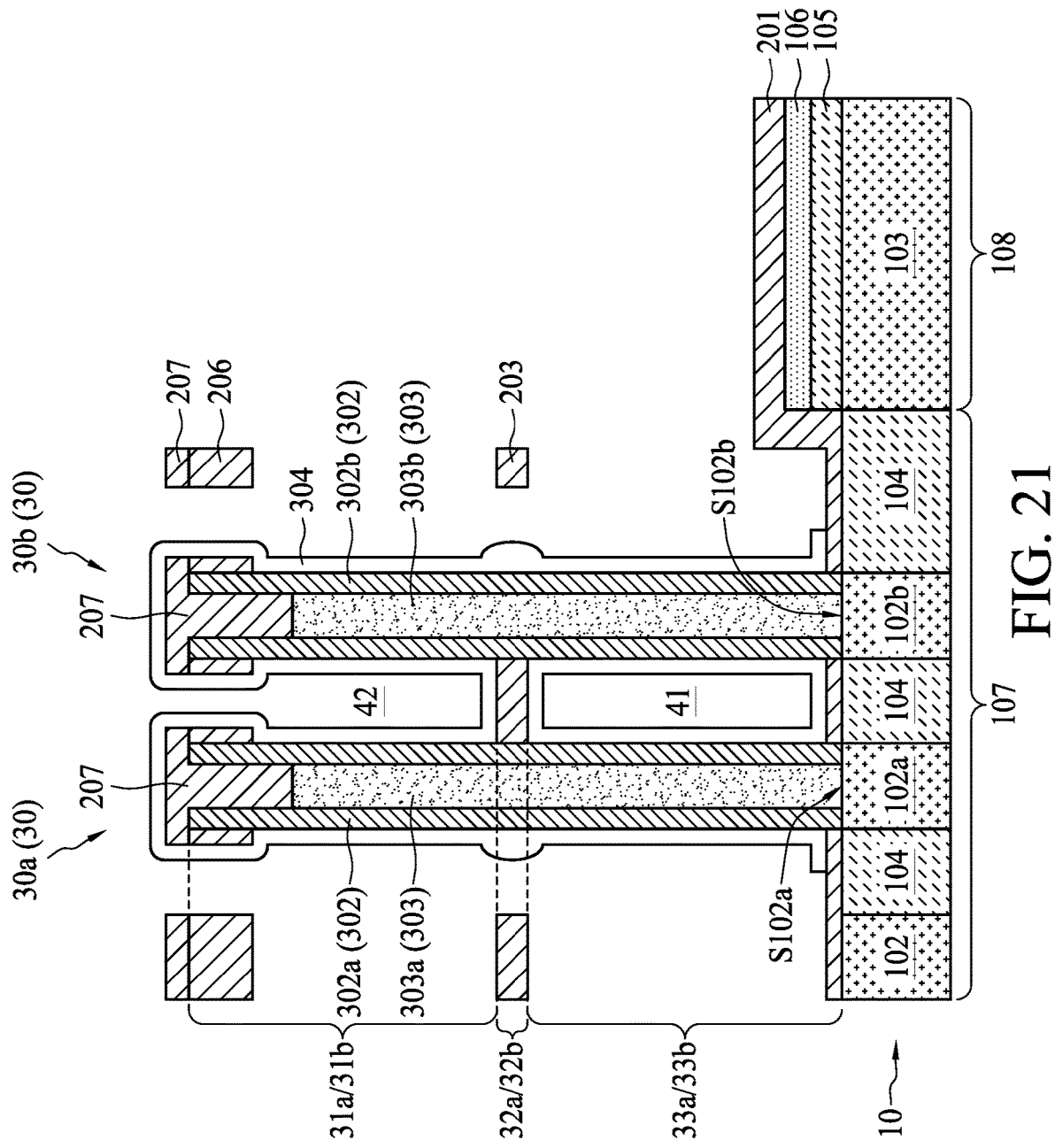

Referring to FIG. 21, FIG. 21 is a schematic cross-sectional diagram at a stage of the method S1 in accordance with some embodiments of the present disclosure. After the operation S16, a portion of the conductive layer 304 is removed. In some embodiments, a protective layer (not shown) is formed and covers at least the dielectric layers 302. In some embodiments, the protective layer laterally surrounds and vertically covers the dielectric layers 302. In some embodiments, a wet etching is performed to remove the portion of the conductive layer 304 exposed through the protective layer. In some embodiments, the protective layer is removed, and a portion of the conductive layer 304 covered by the protective layer is left in place. Other conventional methods can be applied to remove the portion of the conductive layer 304, and a method of the removal is not limited herein.

In some embodiments, a remaining portion of the conductive layer 304 becomes a third electrode 304. In some embodiments, the first electrode 303a may be a top electrode and the third electrode 304 may be a bottom electrode of the first capacitor 30a. In some embodiments, the second electrode 303b may be a top electrode and the third electrode 304 may be a bottom electrode of the second capacitor 30b. In some embodiments, the third electrode 304 is a common electrode of the first capacitor 30a and the second capacitor 30b. In other words, the bottom electrodes of the first capacitor 30a and the second capacitor 30b are physically connected or are a monolithic structure. In some embodiments, the third electrode 304 surrounds the dielectric layers 302, the first electrode 303a, the second electrode 303b, portions of the nitride layers 206 and 207 vertically over the dielectric layers 302 and the electrodes 303a and 303b, and a portion of the second nitride layer 203 contacting the dielectric layers 302. In some embodiments, the third electrode 304 covers a portion of the first nitride layer 201 contacting the dielectric layers 302. In some embodiments, the first capacitor 30a covers an entirety of the top surface S102a of the landing pad 102a. In some embodiments, the second capacitor 30b covers an entirety of the top surface S102b of the landing pad 102b.

For ease of illustration, portions of the first capacitor 30a, the first dielectric layer 302a and the first electrode 303a above the second nitride layer 203 can be referred to as upper portions 31a of such elements; similarly, portions of the second capacitor 30b, the second dielectric layer 302b and the second electrode 303b above the second nitride layer 203 can be referred to as upper portions 31b of such elements. In addition, portions of the first capacitor 30a, the first dielectric layer 302a and the first electrode 303a surrounded by the second nitride layer 203 can be referred to as middle portions 32a of such elements, while portions of the second capacitor 30b, the second dielectric layer 302b and the second electrode 303b surrounded by the second nitride layer 203 can be referred to as middle portions 32b of such elements. Likewise, portions of the first capacitor 30a, the first dielectric layer 302a and the first electrode 303a below the second nitride layer 203 can be referred to as lower portions 33a of such elements; portions of the second capacitor 30b, the second dielectric layer 302b and the second electrode 303b below the second nitride layer 203 can be referred to as lower portions 33b of such elements. For a purpose of simplicity of the drawings and clarity of the illustration, only upper portions 31a and 31b, middle portions 32a and 32b and lower portions 33a and 33b of the first dielectric layer 302a and the second dielectric layer 302b are labelled in the figures and illustrated in the following specification.

In some embodiments, the first gap 41 is disposed between a lower portion 33a of the first dielectric layer 302a and a lower portion 33b of the second dielectric layer 302b. In some embodiments, the first gap 41 is above the first nitride layer 201 and below the second nitride layer 203. In some embodiments, the second gap 42 is disposed between an upper portion 31a of the first dielectric layer 302a and an upper portion 31b of the second dielectric layer 302b. In some embodiments, the second gap 42 is above the second nitride layer 203. It should be noted that positions of the gaps 41 and 42 relative to positions of the electrodes 303a and 303b or the capacitors 30a and 30b can be similar to the positions of the gaps 41 and 42 relative to positions of the dielectric layers 302a and 302b as illustrated above. Repeated illustration is omitted herein.

In some embodiments, the first gap 41 or the second gap 42 is at least partially encircled by the third electrode 303. However, different cross sections may have different arrangements of the third electrode 303 relative to the first gap 41 and/or the second gap 42. In some embodiments, the first gap 41 is entirely encircled by the third electrode 303. In some embodiments, the second gap 42 is an open gap and partially encircled by the third electrode 303 in the cross-sectional view as shown in FIG. 21, which is a schematic cross-sectional diagram along the line A-A' in FIG. 18 at a stage of the method S1.

Figure 22:
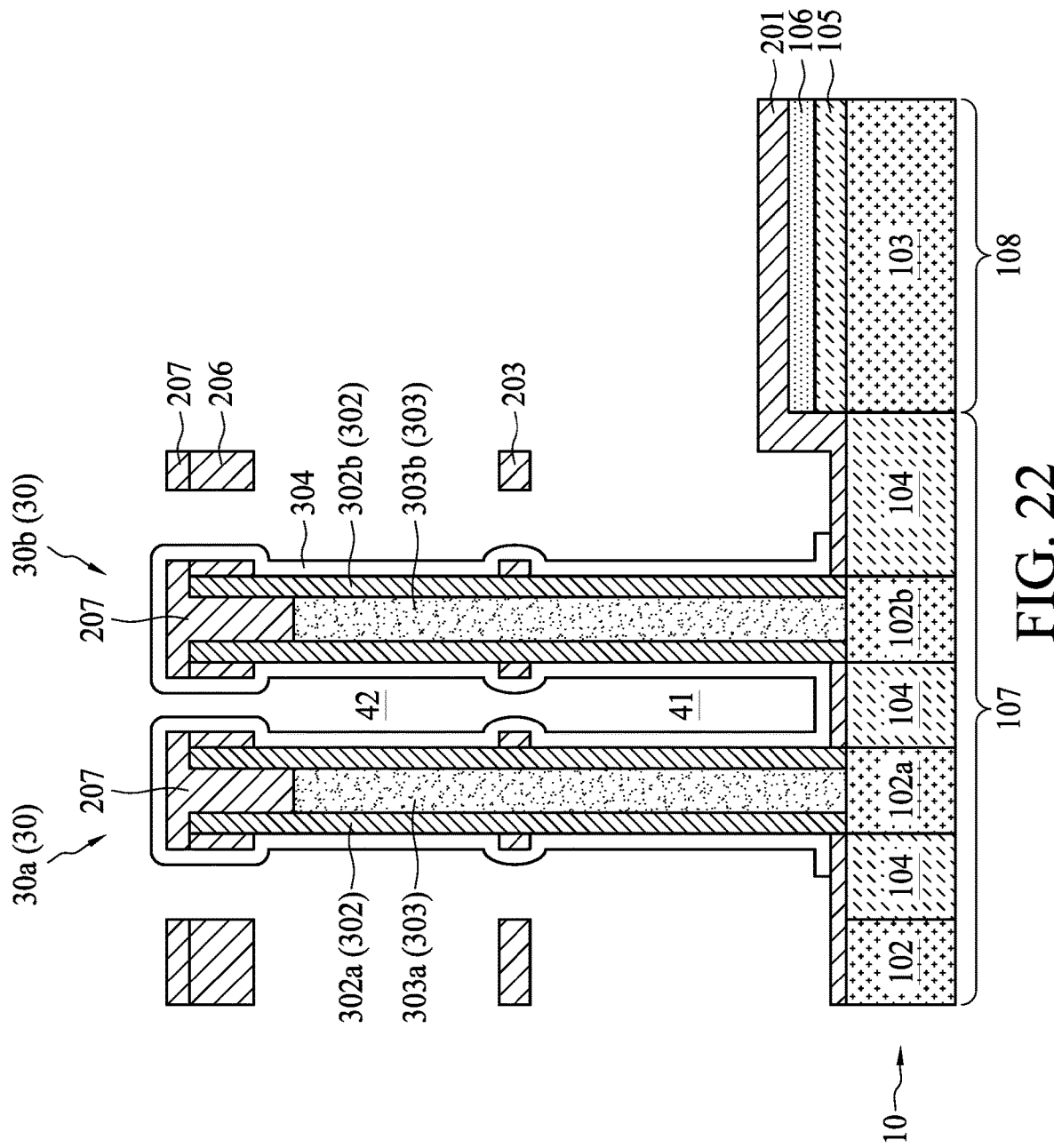
FIG. 22 is a cross-sectional diagram of a semiconductor structure along a line B-B' shown in FIG. 18 in accordance with some embodiments of the present disclosure.

Referring to FIG. 22, FIG. 22 is a schematic cross-sectional diagram along a line B-B' in FIG. 18 at a stage of the method S1 in accordance with some embodiments of the present disclosure. In some embodiments, the first gap 41 and the second gap 42 are connected. In some embodiments, some of the openings 204 are formed between the first dielectric layer 302a and the second dielectric layer 302b as shown in FIG. 8. In some embodiments, portions of the second nitride layer 203 disposed between the first dielectric layer 302a and the second dielectric layer 302b are separated in the cross-sectional view shown in FIG. 22. In some embodiments, the second gap 42 is open toward the first gap 41 and the third nitride layer 207.

Figure 23:
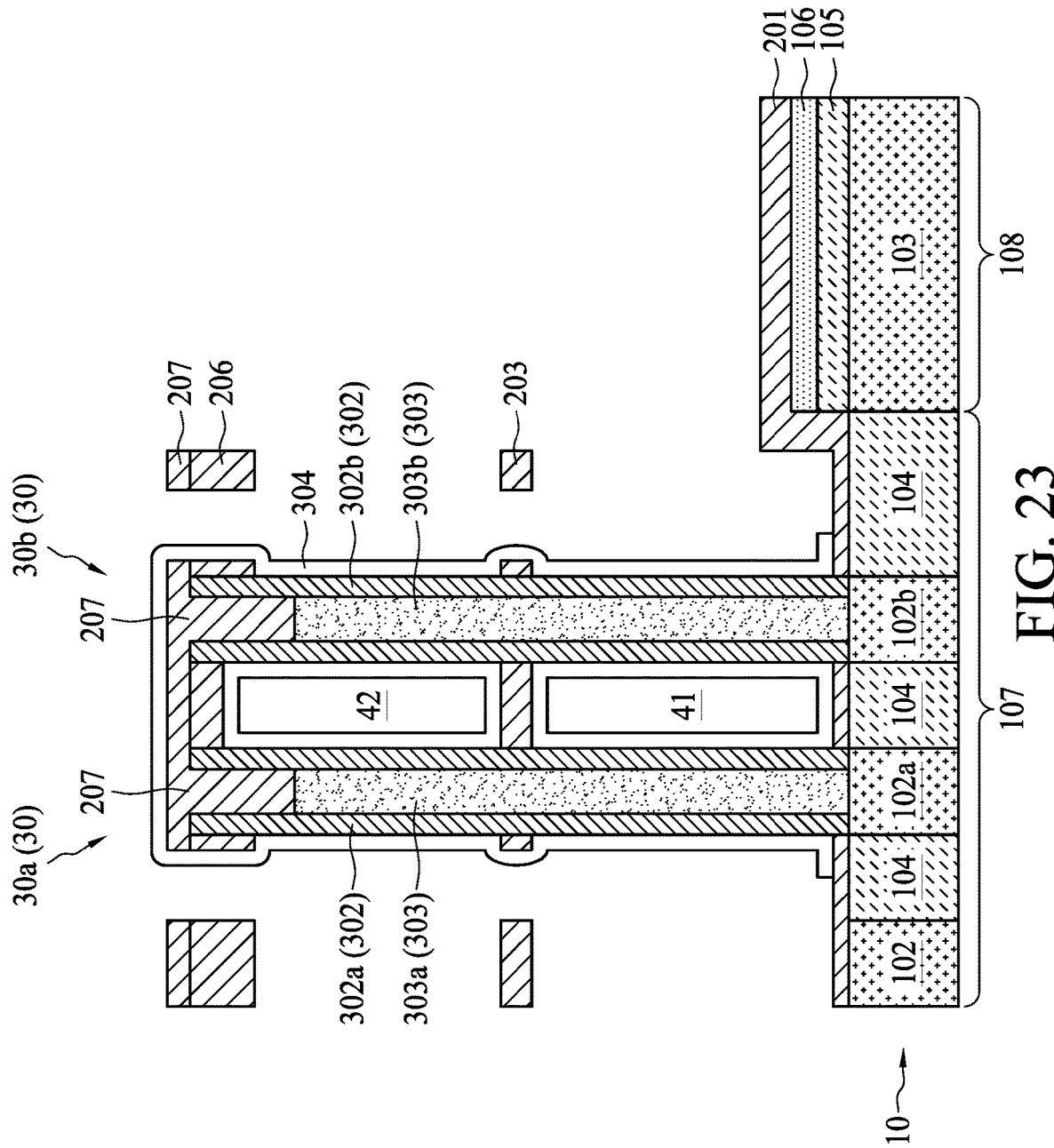
FIG. 23 is a cross-sectional diagram of a semiconductor structure along a line C-C' shown in FIG. 18 in accordance with some embodiments of the present disclosure.

Referring to FIG. 23, FIG. 23 is a schematic cross-sectional diagram along a line C-C' in FIG. 18 at a stage of the method S1 in accordance with some embodiments of the present disclosure. In some embodiments, the first gap 41 and the second gap 42 are both closed gaps in the cross-sectional view shown in FIG. 23. In some embodiments, the first gap 41 is entirely encircled by the third electrode 303. In some embodiments, the second gap 42 is entirely encircled by the third electrode 303. In some embodiments, the second gap 42 is defined by the dielectric layer 302 and the nitride layers 203 and 206.

Figure 24:
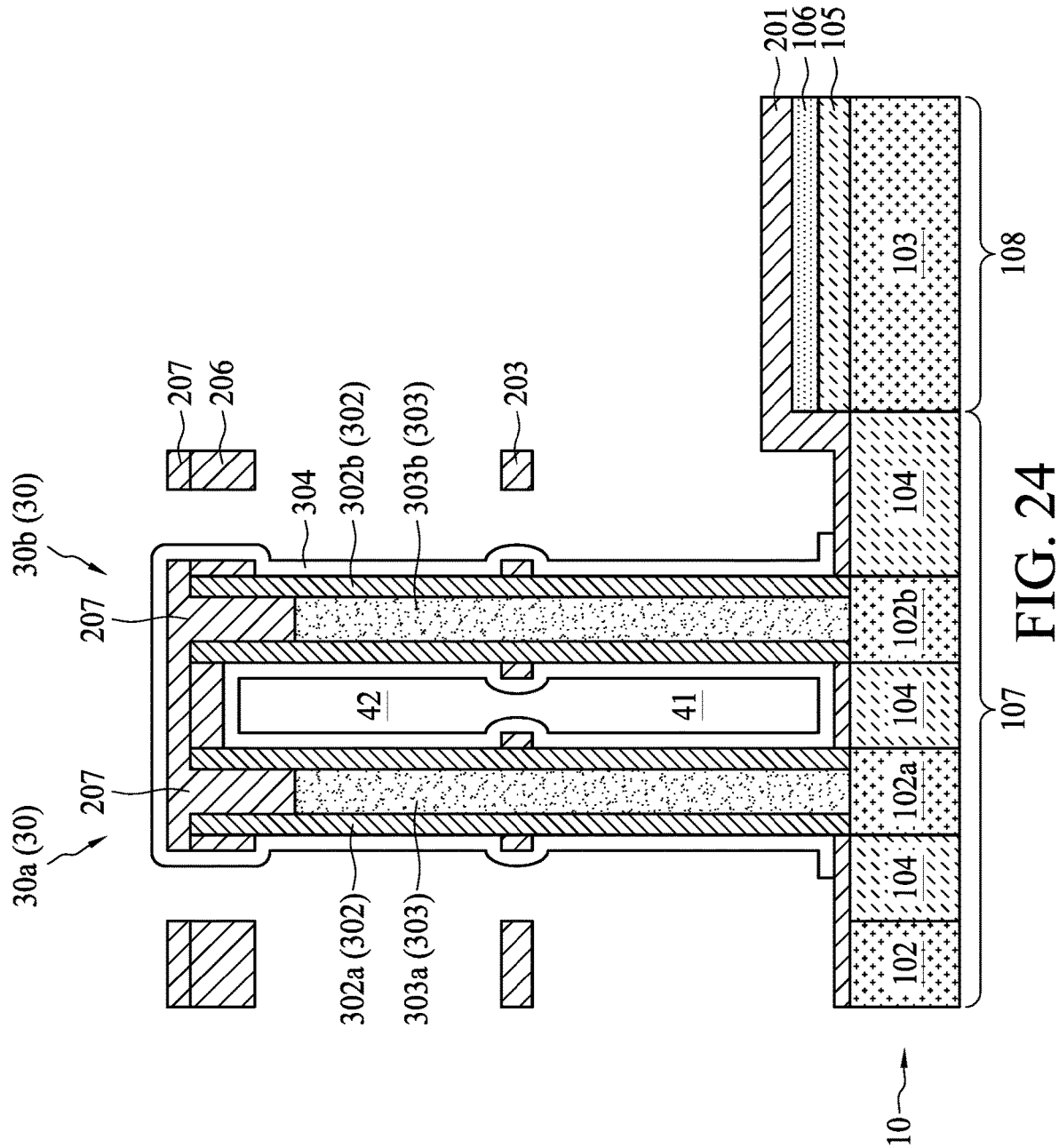
FIG. 24 is a cross-sectional diagram of a semiconductor structure along a line D-D' shown in FIG. 18 in accordance with some embodiments of the present disclosure.

Referring to FIG. 24, FIG. 24 is a schematic cross-sectional diagram along a line D-D' in FIG. 18 at a stage of the method S1 in accordance with some embodiments of the present disclosure. In some embodiments, the second gap 42 is connected to the first gap 41 and encircled by the third electrode 303 in the cross-sectional view as shown in FIG. 24. In some embodiments, a top of the second gap is covered by the nitride layers 206 and 207 and the third electrode 303. In some embodiments, the second gap 42 is open toward the first gap 41.

One aspect of the present disclosure provides a semiconductor structure. The semiconductor structure includes a substrate having a first landing pad therein, and a first capacitor disposed over the substrate. The first capacitor includes: a first electrode, disposed over and extending vertically away from the first landing pad; a first dielectric layer, at least partially surrounding the first electrode, wherein the first electrode is shorter than the first dielectric layer; and a second electrode, surrounding the first dielectric layer and the first electrode.

Another aspect of the present disclosure provides a semiconductor structure. The semiconductor structure includes: a first landing pad and a second landing pad disposed in a substrate; a first conductive layer, disposed over and extending vertically away from the first landing pad; a second conductive layer, disposed over and extending vertically away from the second landing pad; a first dielectric layer, surrounding the first conductive layer; a second dielectric layer, surrounding the second conductive layer; a third conductive layer, surrounding the first dielectric layer and the second dielectric layer; and a first gap, disposed between the first dielectric layer and the second dielectric layer, and at least partially encircled by the third conductive layer.

Another aspect of the present disclosure provides a method of manufacturing a semiconductor structure. The method includes: providing a substrate; forming a first nitride layer, a first sacrificial layer, a second nitride layer, a second sacrificial layer and a third nitride layer in sequence over the substrate; forming a first opening and a second opening, wherein the first opening exposes a first landing pad in the substrate, and a second opening exposes a second landing pad in the substrate; forming a first electrode in the first opening and a second electrode in the second opening; removing the first sacrificial layer and the second sacrificial layer concurrently; and forming a conductive layer, conformal to the first electrode, the second electrode, the first nitride layer, the second nitride layer and the third nitride layer.

In conclusion, the application discloses a semiconductor structure including one or more capacitors over one or more landing pads. The capacitors may include top electrodes on two adjacent landing pads, in which one top electrode is formed over one landing pad. The present disclosure also provides a manufacturing method for forming the semiconductor structure. Connections between different sacrificial layers are provided in the manufacturing method, and thus the different sacrificial layers can be concurrently removed. A manufacturing cost and complexity of the process can be reduced. Moreover, an etch-back operation performed on the top electrodes and formation of a nitride layer between the top electrodes and a bottom electrode of the capacitors can prevent the top electrodes from shorting with the bottom electrode. A monolithic bottom electrode is provided to adjacent capacitors, and thus an electrical connection to the bottom electrode can be simplified.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a semiconductor structure, comprising:
   providing a substrate;
   forming a first nitride layer, a first sacrificial layer, a second nitride layer, a second sacrificial layer and a third nitride layer in sequence over the substrate;
   forming a first opening and a second opening, wherein the first opening exposes a first landing pad in the substrate, and the second opening exposes a second landing pad in the substrate;
   forming a first electrode in the first opening and a second electrode in the second opening;
   removing the first sacrificial layer and the second sacrificial layer concurrently; and
   forming a conductive layer, conformal to the first electrode, the second electrode, the first nitride layer, the second nitride layer and the third nitride layer;
   removing a portion of the second nitride layer, thereby exposing the first sacrificial layer, after the formation of the second nitride layer;
   wherein the second sacrificial layer contacts the first sacrificial layer.

2. The method of claim 1, further comprising:
   removing a portion of the third nitride layer, thereby exposing the second sacrificial layer, after the formation of the third nitride layer.

3. The method of claim 1, wherein a wet etching operation is performed to remove the first sacrificial layer and the second sacrificial layer concurrently.

4. The method of claim 1, wherein the first sacrificial layer includes borophosphosilicate glass (BPSG).

5. The method of claim 1, wherein the second sacrificial layer includes silane oxide.

6. The method of claim 1, further comprising:
   forming a high-k layer, thereby lining sidewalls of the first opening and the second opening, prior to the formation of the first electrode and the second electrode.

7. The method of claim 1, further comprising:
   removing a top portion of the first electrode in the first opening and a top portion of the second electrode in the second opening.

8. The method of claim 7, further comprising:
   forming a fourth nitride layer, thereby filling the first opening over the first electrode and the second opening over the second electrode, prior to the removal of the first sacrificial layer and the second sacrificial layer.

9. The method of claim 8, wherein the fourth nitride layer is disposed over the third nitride layer.

10. The method of claim 8, wherein the conductive layer surrounds the fourth nitride layer.

11. The method of claim 1, wherein a first gap is formed between the first electrode and the second electrode and between the second nitride layer and the third nitride layer after the removal of the first sacrificial layer and the second sacrificial layer.

12. The method of claim 11, wherein the conductive layer encircles the first gap from a cross-sectional view.

13. The method of claim 1, wherein a second gap is formed between the first electrode and the second electrode and between the first nitride layer and the second nitride layer after the removal of the first sacrificial layer and the second sacrificial layer.

14. The method of claim 13, wherein the conductive layer at least partially encircles the second gap.

15. The method of claim 1, wherein the first opening exposes an entirety of a top surface of the first landing pad, and the second opening exposes an entirety of a top surface of the second landing pad.

* * * * *